(12) United States Patent
Konno

(10) Patent No.: US 8,350,277 B2
(45) Date of Patent: *Jan. 8, 2013

(54) LIGHT EMITTING ELEMENT

(75) Inventor: Taichiroo Konno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 362 days.

This patent is subject to a terminal disclaimer.

(21) Appl. No.: 12/706,300

(22) Filed: Feb. 16, 2010

(65) Prior Publication Data

US 2011/0079800 A1 Apr. 7, 2011

(30) Foreign Application Priority Data

Oct. 5, 2009 (JP) .................................. 2009-231157

(51) Int. Cl.
*H01L 33/00* (2010.01)
(52) U.S. Cl. ................ 257/95; 257/13; 257/15; 257/81; 257/86; 257/96
(58) Field of Classification Search ........................ None
See application file for complete search history.

(56) References Cited

U.S. PATENT DOCUMENTS

| 5,260,589 A | 11/1993 | Yamauchi et al. |
| 2002/0195609 A1 * | 12/2002 | Yoshitake et al. ............... 257/81 |

FOREIGN PATENT DOCUMENTS

JP 5-37017 2/1993

* cited by examiner

*Primary Examiner* — Kyoung Lee
(74) *Attorney, Agent, or Firm* — Scully, Scott, Murphy & Presser, PC

(57) ABSTRACT

A light emitting element includes a semiconductor substrate, a light emitting part having a first and second conductivity type cladding layers and an active layer sandwiched between the cladding layers. A reflecting part is disposed between the substrate and the light emitting part. A current dispersing layer disposed on a side of the light emitting part opposite to the reflecting. The reflecting part has at least three pair layers of first and second semiconductor layers, the first semiconductor layer has a first thickness, the second semiconductor layer has a second thickness and a plurality of pair layers of the reflecting part have a different thickness to each other as values of the incident angle of light are different with respect to each pair layer. At least one pair layer is defined by the incident angle of light being not less than 50 degrees.

10 Claims, 12 Drawing Sheets

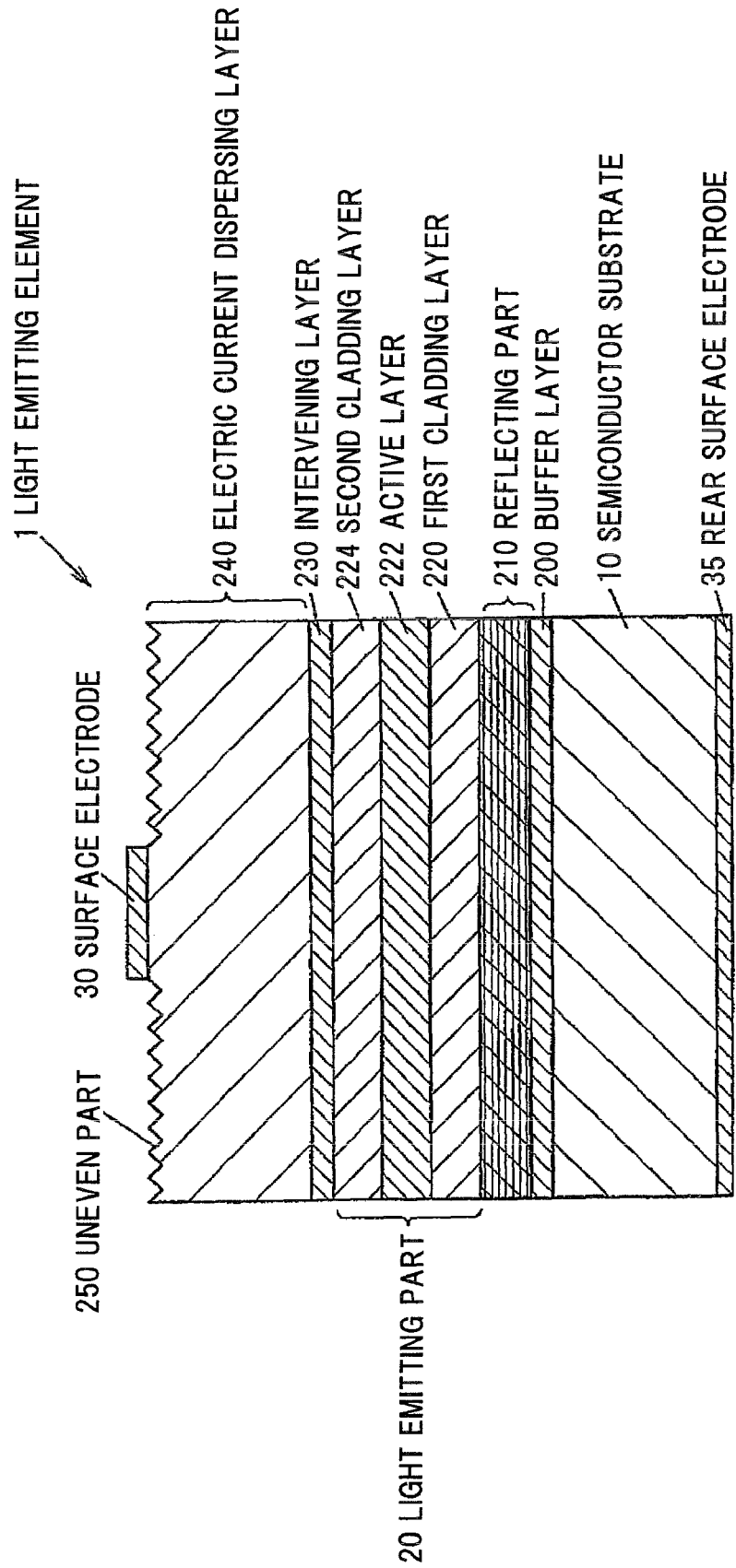

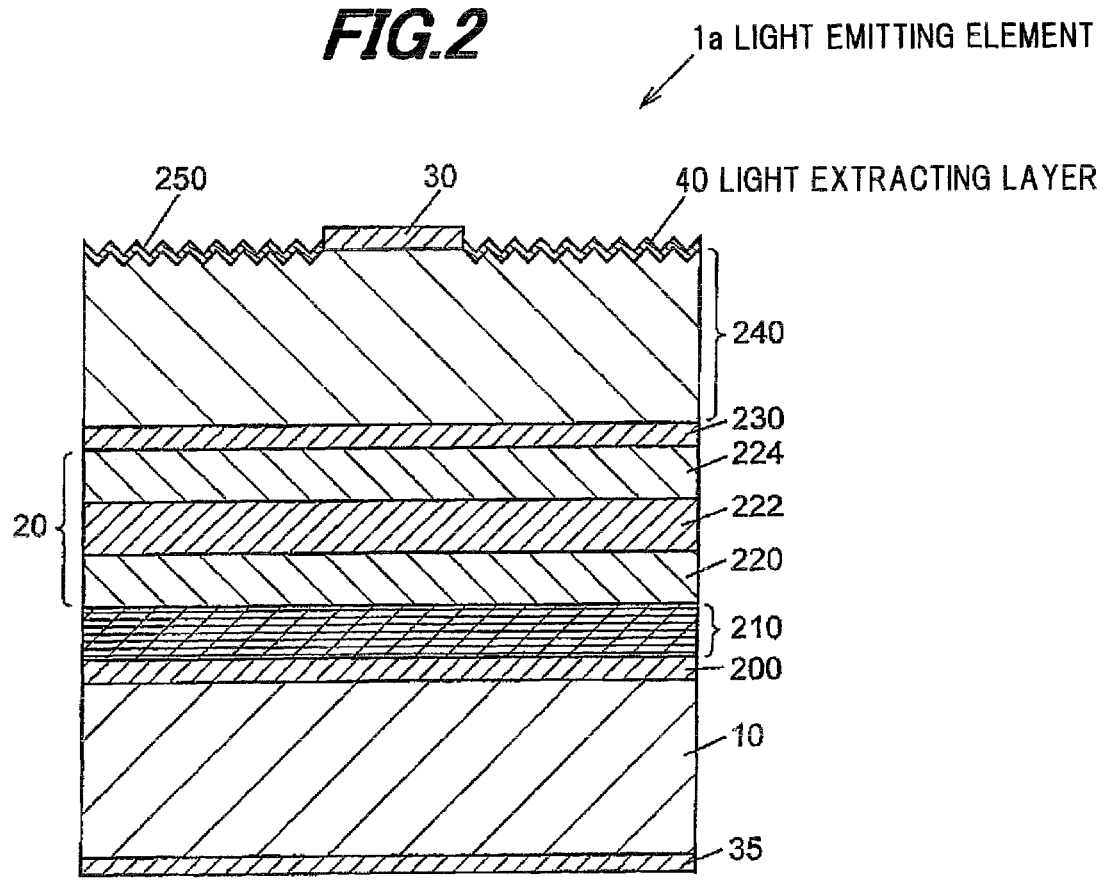

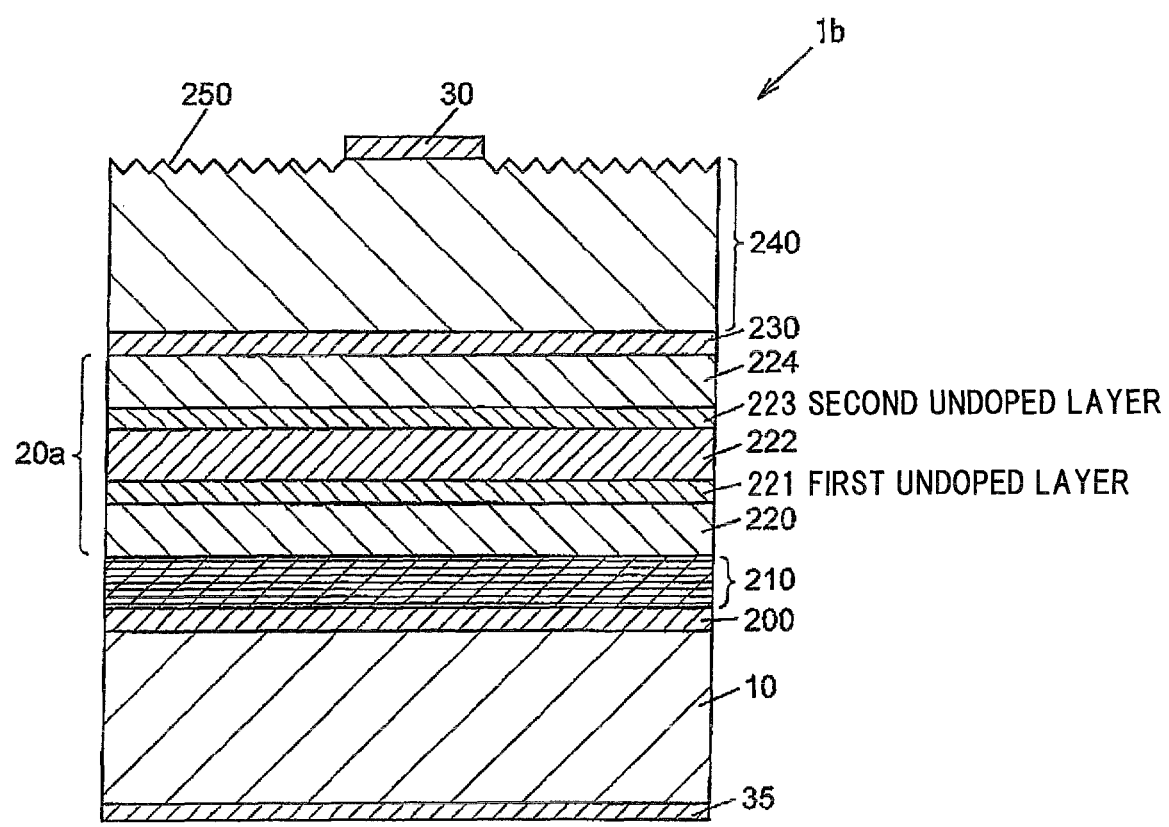

0° DBR LAYER — 210b
40° DBR LAYER — 210a
70° DBR LAYER — 210b
— 210a
— 10

| 244 SECOND ELECTRIC CURRENT DISPERSING LAYER |
| 242 FIRST ELECTRIC CURRENT DISPERSING LAYER |

LIGHT EMITTING ELEMENT

The present application is based on Japanese patent application No. 2009-231157 filed on Oct. 5, 2009, the entire contents of which are incorporated herein by reference.

BACKGROUND OF THE INVENTION

1. Field of the Invention

This invention relates to a light emitting element. In particular, this invention relates to a light emitting element including a semiconductor substrate opaque to a light emitted from an active layer and a reflecting part disposed between the semiconductor substrate and the active layer so as to have a thickness of not less than a predetermined value.

2. Description of the Related Art

Conventionally, a light emitting element is known that includes an n-type GaAs substrate, a light reflection layer disposed on the n-type GaAs substrate, an n-type $Al_{0.45}Ga_{0.55}As$ cladding layer disposed on the light reflection layer, a p-type GaAs active layer disposed on the n-type $Al_{0.45}Ga_{0.55}As$ cladding layer, a p-type $Al_{0.45}Ga_{0.55}As$ cladding layer disposed on the p-type GaAs active layer, and a p-type GaAs cap layer disposed on the p-type $Al_{0.45}Ga_{0.55}As$ cladding layer, wherein the light reflection layer has a laminated structure of an n-type AlAs/an n-type $Al_xGa_{1-x}As$, the laminated structure is formed so as to have a chirp-like shape where the film thicknesses are sequentially changed, and a relationship among a changed thickness ratio, a number of the laminated layers, and a mixed crystal ratio is defined, by which a predetermined reflection wavelength width and reflectance can be obtained. The technique is disclosed in, for example, JP-A-5-37017(JP-A1993-37017).

The light emitting element disclosed in the JP-A-5-37017 has the light reflection layer capable of reflecting a light traveling to a side of the substrate by light wave interference, so that light emission output can be enhanced.

However, although the light emitting element disclosed in the JP-A-5-37017 is capable of broadening reflection wavelength region in a single body of the light reflection layer, if the light reflection layer has a thickness of not less than a predetermined value, the light emission output can not be increased, similarly to a case of using a light reflection layer that does not have the chirp-like shape. Consequently, the light emitting element of the JP-A-5-37017 discloses that the changed thickness ratio DD is preferably almost 0.1 to 0.15, thicknesses of the pair layer are preferably T (1−DD) and T (1+DD), if standard thickness is defines as T, and the number of the laminated layers of the light reflection layer is preferably almost 20 to 30. Here, if a light emission wavelength is set to 631 nm in the composition of the light emitting element disclosed in the JP-A-5-37017, a thickness of the light reflection layer becomes almost 2 to 3 µm. Namely, if the thickness of the light reflection layer becomes not less than 2 µm, enhancement of the light emission output is saturated in the light emitting element disclosed in the JP-A-5-37017, and there is a limitation to the enhancement of the light emission output.

SUMMARY OF THE INVENTION

Therefore, it is an object of the invention to solve the above-mentioned problem and provide a light emitting element that is capable of enhancing a light emission output in accordance with increase in thickness of a reflecting layer, even if the reflecting layer has a thickness of not less than a predetermined value.

(1) According to one embodiment of the invention, a light emitting element comprises:

a semiconductor substrate;

a light emitting part having a first conductivity type first cladding layer; a second conductivity type second cladding layer different from the first cladding layer in the conductivity type and an active layer sandwiched between the first cladding layer and the second cladding layer;

a reflecting part for reflecting a light emitted from the active layer, disposed between the semiconductor substrate and the light emitting part so as to have a thickness of 1.7 µm to 8.0 µm; and an electric current dispersing layer disposed on a side of the light emitting part opposite to the reflecting part, having a uneven part on the surface thereof, wherein the reflecting part is formed so as to have at least three pair layers formed of a first semiconductor layer and a second semiconductor layer different from the first semiconductor layer, the first semiconductor layer has a thickness $T_A$ defined by the formula (1), if peak wavelength of the light emitted from the active layer is $\lambda_P$, refractive index of the first semiconductor layer is $n_A$, refractive index of the second semiconductor layer is $n_B$, refractive index of the first cladding layer is $n_{In}$, and incident angle of light to the second semiconductor layer is θ, the second semiconductor layer has a thickness $T_B$ defined by the formula (2), and a plurality of pair layers of the reflecting part have a different thickness to each other according as values of the incident angle of light θ in the formulae (1) and (2) are different with respect to each pair layer, and at least one pair layer includes the first semiconductor layer and the second semiconductor layer defined by that the incident angle of light θ is not less than 50 degrees.

$$T_A = \frac{\lambda_p}{4n_A\sqrt{1-\left(\frac{n_{In}\sin\theta}{n_A}\right)^2}} \quad (1)$$

$$T_B = \frac{\lambda_p}{4n_B\sqrt{1-\left(\frac{n_{In}\sin\theta}{n_B}\right)^2}} \quad (2)$$

In the above embodiment (1), the following modifications and changes can be made.

(i) The reflecting part has not less than 15 pair layers.

(ii) The pair layers include the first semiconductor layer having the thickness $T_A$ of not less than 1.5 times of $\lambda_P/4n_A$ and the second semiconductor layer having the thickness $T_B$ of not less than 1.5 times of $\lambda_P/4n_B$.

(iii) The first semiconductor layer is formed of $Al_xGa_{1-x}As$, where $0 \leq x \leq 1$, and the second semiconductor layer is formed of $Al_yGa_{1-y}As$, where $0 \leq y \leq 1$ and has refractive index different from that of the first semiconductor layer.

(iv) The first semiconductor layer located at the first pair layer or the first and second pair layers of the reflecting part from a side of the semiconductor substrate is formed of AlAs, the second semiconductor layer located at the first pair layer or the first and second pair layers of the reflecting part from the side of the semiconductor substrate is formed of $Al_xGa_{1-x}As$, where $0 \leq x \leq 1$, having bandgap energy smaller than that of the semiconductor constituting the active layer, or $Al_xGa_{1-x}As$, where $0 \leq x \leq 1$, opaque to the light emitted from the active layer, and the first semiconductor layer and the second semiconductor layer located at the third or later pair layers of the reflecting part from the side of the semiconductor substrate are formed of $Al_xGa_{1-x}As$, where $0 \leq x \leq 1$, transparent to the light emitted from the active layer.

(v) The first semiconductor layer and the second semiconductor layer are formed of $(Al_xGa_{1-x})_yIn_{1-y}P$, where $0 \leq x \leq 1$, $0.4 \leq y \leq 0.6$, having refractive index different from each other.

(vi) The first semiconductor layer is formed of $(Al_xGa_{1-x})_yIn_{1-y}P$, where $0 \leq x \leq 1$, $0.4 \leq y \leq 0.6$ and the second semiconductor layer is formed of $Al_xGa_{1-x}As$, where $0 \leq x \leq 1$, or the first semiconductor layer is formed of $Al_xGa_{1-x}As$, where $0 \leq x \leq 1$ and the second semiconductor layer is formed of $(Al_xGa_{1-x})_yIn_{1-y}P$, where $0 \leq x \leq 1$, $0.4 \leq y \leq 0.6$.

(vii) The electric current dispersing layer includes a first electric current dispersing layer and a second electric current dispersing layer having carrier concentration or impurity concentration different from each other, the second electric current dispersing layer is formed in a side of surface of the electric current dispersing layer so as to have the carrier concentration or the impurity concentration higher than the first electric current dispersing layer.

(viii) The light emitting element further comprises a surface electrode formed on the surface of the electric current dispersing layer; and a light extracting layer is formed on the surface of the electric current dispersing layer except for a region where the surface electrode is formed so as to be formed of a material being transparent to the light emitted from the active layer and having refractive index at the level intermediate between the semiconductor constituting the electric current dispersing layer and air.

(ix) The light extracting layer has a thickness d that is ranged within ±30% of a value defined by a formula $A \times \lambda_P/(4 \times n)$, if wavelength of the light emitted from the active layer is $\lambda_P$, refractive index of the material constituting the light extracting layer is n and A is a constant number, where A is odd numbers.

Advantages of the Invention

According to the invention, a light emitting element that is capable of enhancing a light emission output in accordance with increase in thickness of a reflecting layer, even if the reflecting layer has a thickness of not less than a predetermined value.

BRIEF DESCRIPTION OF THE DRAWINGS

The preferred embodiments according to the invention will be explained below referring to the drawings, wherein:

FIG. 1A is a cross-sectional view schematically showing a light emitting element according to a first embodiment of the invention;

FIG. 2 is a cross-sectional view schematically showing a light emitting element according to a second embodiment of the invention;

FIG. 3 is a cross-sectional view schematically showing a light emitting element according to a third embodiment of the invention;

DETAILED DESCRIPTION OF THE PREFERRED EMBODIMENTS

Summary of Embodiment

A light emitting element according to an embodiment of the invention includes a semiconductor substrate, a light emitting part having a first conductivity type first cladding layer; a second conductivity type second cladding layer different from the first cladding layer in the conductivity type and an active layer sandwiched between the first cladding layer and the second cladding layer, a reflecting part for reflecting a light emitted from the active layer, disposed between the semiconductor substrate and the light emitting part so as to have a thickness of 1.7 μm to 8.0 μm and an electric current dispersing layer disposed on a side of the light emitting part opposite to the reflecting part, having a uneven part on the surface thereof, wherein the reflecting part is formed so as to have at least three pair layers formed of a first semiconductor layer and a second semiconductor layer different from the first semiconductor layer, the first semiconductor layer has a thickness $T_A$ defined by the formula (1), if peak wavelength of the light emitted from the active layer is $\lambda_P$, refractive index of the first semiconductor layer is $n_A$, refractive index of the second semiconductor layer is $n_B$, refractive index of the first cladding layer is $n_{In}$, and incident angle of light to the second semiconductor layer is θ, the second semiconductor layer has a thickness $T_B$ defined by the formula (2), and a plurality of pair layers of the reflecting part have a different thickness to each other according as values of the incident angle of light θ in the formulae (1) and (2) are different with respect to each pair layer, and at least one pair layer includes the first semiconductor layer and the second semiconductor layer defined by that the incident angle of light θ is not less than 50 degrees.

First Embodiment

Figure 1B:
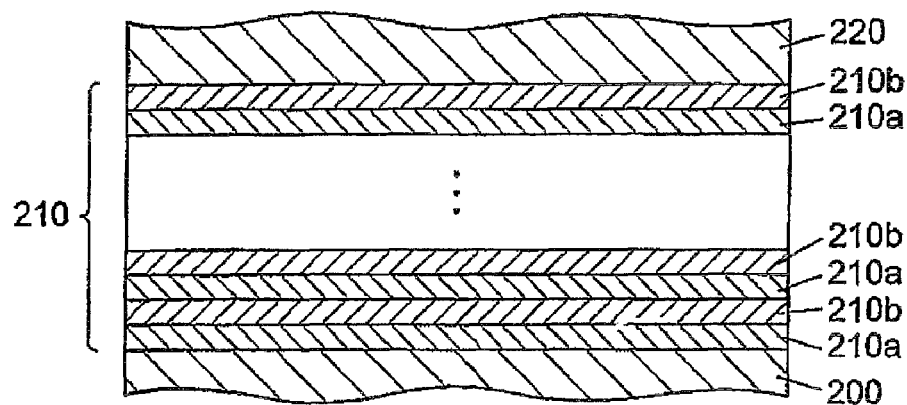
FIG. 1B is a cross-sectional view schematically showing a reflecting part included in the light emitting element according to the first embodiment of the invention.
Figure 1C:
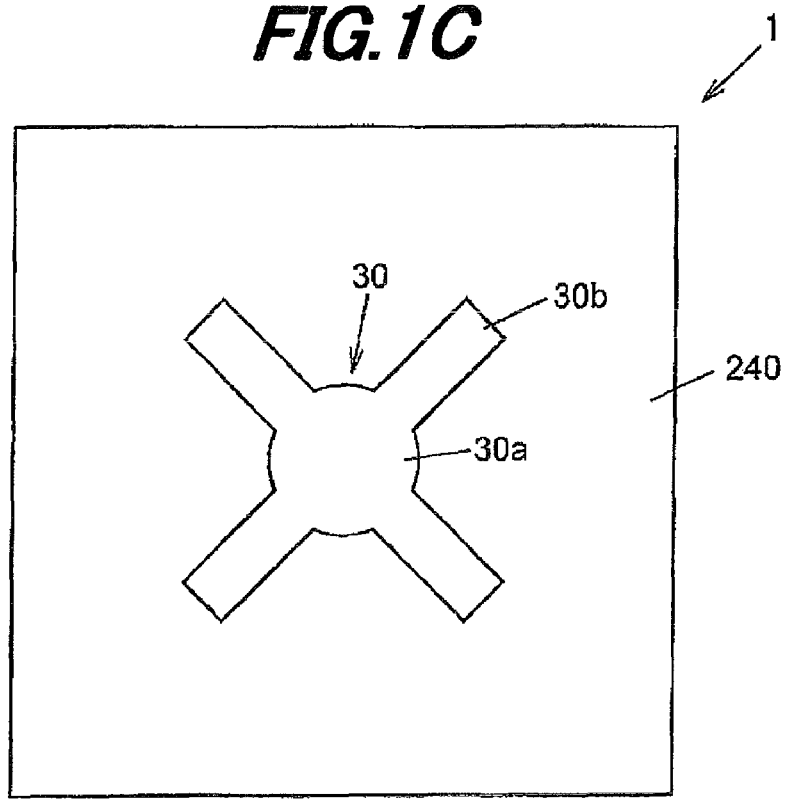
FIG. 1C is a plan view schematically showing a light emitting element according to a first embodiment of the invention.

FIG. 1A is a cross-sectional view schematically showing a light emitting element according to a first embodiment of the invention, and FIG. 1B is a cross-sectional view schematically showing a reflecting part included in the light emitting element according to the first embodiment of the invention. Further, FIG. 1C is a plan view schematically showing a light emitting element according to a first embodiment of the invention.

Structural Outline of Light Emitting Element 1

The light emitting element 1 is, as an example, a light emitting diode (LED) for emitting a red light having peak wavelength ($\lambda_P$) adjacent to 631 nm. Particularly, the light emitting element 1 includes an n-type as a first conductivity type semiconductor substrate 10, an n-type buffer layer 200 disposed on the semiconductor substrate 10, a reflecting part 210 disposed on the buffer layer 200 so as to have a laminated structure of an n-type compound semiconductor, an n-type first cladding layer 220 disposed on the reflecting part 210, an active layer 222 disposed on the first cladding layer 220, a p-type as a second conductivity type different from the first conductivity type second cladding layer 224 disposed on the active layer 222, a p-type intervening layer 230 disposed on the second cladding layer 224, and a p-type electric current dispersing layer 240 disposed on the intervening layer 230 so as to have a uneven part 250 on a surface, namely, a light extracting surface.

Also, the light emitting element 1 includes a surface electrode 30 formed at a predetermined location of a region of the electric current dispersing layer 240 except for a region where the uneven part 250 is disposed and a rear surface electrode 35 disposed on a surface of the semiconductor substrate 10 opposite to a surface where the buffer layer 200 is disposed, namely, a rear surface of the semiconductor substrate 10. In the embodiment, the active layer 222 is disposed so as to be sandwiched between the n-type first cladding layer 220 and the second cladding layer 224, and hereinafter, the n-type first cladding layer 220, the active layer 222 and the second cladding layer 224 may be collectively-referred to as a light emitting part 20. Further, the light emitting element 1 can further include a pad electrode as a pad for wire bonding on the surface electrode 30.

Semiconductor Substrate 10

As the semiconductor substrate 10, for example, a GaAs substrate can be used, that includes a predetermined conductivity type carrier and has a predetermined carrier concentration. Also, as the semiconductor substrate 10, an off substrate having a predetermined off angle or a just substrate having no off angle can be used. Further, in accordance with types of a plurality of compound semiconductor layers formed on the semiconductor substrate 10, a compound semiconductor material constituting the semiconductor substrate 10 can be appropriately changed.

Reflecting Part 210

The reflecting part 210 is disposed between the semiconductor substrate 10 and the light emitting part 20 so as to reflect a light emitted from the active layer 222. And, the reflecting part 210 is formed of a semiconductor material, for example, $Al_xGa_{1-x}As$, where $0 \leq x \leq 1$ having bandgap energy larger than a semiconductor constituting the active layer 222, being transparent to the light emitted from the active layer 222, and being almost lattice-matched with the active layer 222 and the semiconductor substrate 10. Also, it is preferable that the reflecting part 210 has a thickness of 1.7 μm to 8.0 μm.

Particularly, as shown in FIG. 1B, the reflecting part 210 is formed so as to have a laminated structure of a plurality of compound semiconductors. Also, the reflecting part 210 is formed so as to have a plurality of pair layers formed of a first semiconductor layer 210a and a second semiconductor layer 210b having a refractive index different from that of the first semiconductor layer 210a respectively. The reflecting part 210 is formed so as to have at least 3, preferably not less than 15 pair layers. And, the first semiconductor layer 210a is formed of, for example, $Al_xGa_{1-x}As$, where $0 \leq x \leq 1$, and the second semiconductor layer 210b is formed of, for example, $Al_yGa_{1-y}As$, where $0 \leq y \leq 1$. And, the first semiconductor layer 210a and the second semiconductor layer 210b are formed so as to have a refractive index different from each other. Further, if the first semiconductor layer 210a is formed of AlGaAs, an Al composition ratio "x" of the first semiconductor layer 210a is controlled so as to be different from an Al composition ratio "y" of the second semiconductor layer 210b.

Also, the first and second semiconductor layers 210a, 210b can be formed so as to have a thickness corresponding to an incident angle of the light as mentioned below, but in FIG. 1B, for convenience of explanation, they are shown so as to have a thickness almost equal to each other. Further, the first and second semiconductor layers 210a, 210b can be also formed of $(Al_xGa_{1-x})_yIn_{1-y}P$, where $0 \leq x \leq 1$, $0.4 \leq y \leq 0.6$, having refractive index different from each other. Furthermore, the first semiconductor layer 210a can be formed of $(Al_xGa_{1-x})_yIn_{1-y}P$, where $0 \leq x \leq 1$, $0.4 \leq y \leq 0.6$ and the second semiconductor layer 210b can be formed of $Al_xGa_{1-x}As$, where or the first semiconductor layer 210a can be formed of $Al_xGa_{1-x}As$, where $0 \leq x \leq 1$ and the second semiconductor layer 210b can be formed of $(Al_xGa_{1-x})_yIn_{1-y}P$, where $0 \leq x \leq 1$, $0.4 \leq y \leq 0.6$.

Here, each of the plural pair layers included in the reflecting part 210 reflects a light having a wavelength not less than a light emission peak wavelength of the light emitted from the active layer 222, and reflects a light having an incident angle different from each other respectively. Particularly, the first semiconductor layer 210a is formed so as to have a thickness $T_A$ described below defined by the formula (1), if peak wavelength of the light emitted from the active layer 222 is $\lambda_P$, refractive index of the first semiconductor layer 210a is $n_A$, refractive index of the second semiconductor layer 210b is $n_B$, refractive index of the first cladding layer 220 is $n_{In}$, and incident angle of light to the second semiconductor layer 210b is θ. Also, the second semiconductor layer 210b is formed so as to have a thickness $T_B$ defined by the formula (2) described below.

$$T_A = \frac{\lambda_p}{4n_A \sqrt{1 - \left(\frac{n_{In} \sin\theta}{n_A}\right)^2}} \quad (1)$$

$$T_B = \frac{\lambda_p}{4n_B \sqrt{1 - \left(\frac{n_{In} \sin\theta}{n_B}\right)^2}} \quad (2)$$

The first semiconductor layer 210a included in one pair layer of the plural pair layers is formed so as to have a thickness calculated from the formula (1) corresponding to an incident angle θ of a light entering into the one pair layer. Similarly, the second semiconductor layer 210b included in the one pair layer is also formed so as to have a thickness calculated from the formula (2) corresponding to the incident angle θ. Similarly, another pair layer included in the plural pair layers are formed so as to include the first and second semiconductor layer 210a, 210b having each thickness corresponding to the incident angles θ of a light entering into the another pair layer. Further, it is preferable that the pair layers include the first semiconductor layer 210a having the thickness $T_A$ of not less than 1.5 times of $\lambda_P/4n_A$ and the second semiconductor layer 210b having the thickness $T_B$ of not less than 1.5 times of $\lambda_P/4n_B$.

Here, in the embodiment, the reflecting part 210 is formed so as to have at least 3 pair layers. And, each of the plural pair layers has a thickness different from each other due to the fact that the value of θ in the formulae 1, 2 is different with respect to each pair layer. For example, one pair layer is formed so as to have a thick different from that of another pair layer. And, if a value of θ in one pair layer is defined as θa and a value of θ in another pair layer is defined as θb, thicknesses of the first semiconductor layer 210a and the second semiconductor layer 210b included in the one pair layer are calculated from the formulae 1, 2 by using the value of θa, and thicknesses of the first semiconductor layer 210a and the second semiconductor layer 210b included in the another pair layer are calculated from the formulae 1, 2 by using the value of θb different from the value of θa. Further, at least one pair layer is formed so as to include the first semiconductor layer 210a and the second semiconductor layer 210b having a thickness defined by a value of θ that is not less than 50 degrees, so that a light entering into the reflecting part 210 from the light emitting part 20 except for a direct incident light can be reflected in a direction of the light extracting surface in the reflecting part 210. The light emitting element 1 according to the embodiment includes the reflecting part 210 described above, so that even if a light emitted from the active layer 222 enters into the reflecting part 210 at various incident angles, the light can be reflected in a direction of the light extracting surface in the reflecting part 210.

Also, it is preferable that the first semiconductor layer 210a located at the first pair layer or the first and second pair layers of the reflecting part 210 from a side of the semiconductor substrate 10 is formed of AlAs. And, in this case, it is preferable that the second semiconductor layer 210b located at the first pair layer or the first and second pair layers of the reflecting part 210 from the side of the semiconductor substrate 10 is formed of $Al_xGa_{1-x}As$, where $0 \leqq x \leqq 1$, having bandgap energy smaller than that of the semiconductor constituting the active layer 222, or $Al_xGa_{1-x}As$, where $0 \leqq x \leqq 1$, opaque to the light emitted from the active layer 222. Further, in this case, it is preferable that the second semiconductor layer 210b located at the third or later pair layers of the reflecting part 210 from the side of the semiconductor substrate 10 are formed of $Al_xGa_{1-x}As$, where $0 \leqq x \leqq 1$, transparent to the light emitted from the active layer 222.

Light Emitting Part 20

The light emitting part 20 includes the first cladding layer 220, the active layer 222, and the second cladding layer 224. First, the buffer layer 200 is disposed so as to contact the semiconductor substrate 10. For example, if the semiconductor substrate 10 is formed of an n-type GaAs layer, the buffer layer 200 is formed of the n-type GaAs layer. Also, the first cladding layer 220, the active layer 222, and the second cladding layer 224 are respectively formed of, for example, a three components or a four components III group compound semiconductor material represented by, for example, $(Al_xGa_{1-x})_yIn_{1-y}P$, where $0 \leqq x \leqq 1$, $0 \leqq y \leqq 1$. Further, the active layer 222 used in the first embodiment can be also formed of, for example, a single layer of nondoped $Ga_xIn_{1-x}P$, where $0 \leqq x \leqq 1$.

Intervening Layer 230

In case that a semiconductor material constituting the second cladding layer 224 and a semiconductor material constituting the electric current dispersing layer 240 are different from each other, the intervening layer 230 is formed of a semiconductor material that is capable of reducing potential barrier of a hetero interface between the second cladding layer 224 and the electric current dispersing layer 240. Particularly, the intervening layer 230 is disposed between the second cladding layer 224 and the electric current dispersing layer 240. More particularly, the intervening layer 230 is disposed in a side of the second cladding layer 224 opposite to the active layer 222, and it is formed of a semiconductor material having a bandgap energy at the level intermediate between a bandgap energy of a semiconductor material constituting the second cladding layer 224 and a bandgap energy of a semiconductor material constituting the electric current dispersing layer 240. For example, the intervening layer 230 is formed of a p-type $Ga_zIn_{1-z}P$, where as an example, $0.6 \leqq z \leqq 0.9$. The light emitting element 1 includes the intervening layer 230, so that a forward voltage of the light emitting element 1 can be reduced.

Electric Current Dispersing Layer 240

The electric current dispersing layer 240 is disposed in a side of the light emitting part 20 opposite to the reflecting part 210, namely, between the light emitting part 20 and the surface electrode 30, and it allows electric current supplied to the light emitting element 1 to be dispersed so that the electric current can be almost uniformly supplied to the active layer 222. Also, the electric current dispersing layer 240 is formed of a semiconductor material transmitting a light emitted from the active layer 222. For example, the electric current dispersing layer 240 can be formed of a p-type GaP, a p-type GaAsP, or a p-type AlGaAs. And, the electric current dispersing layer 240 has an uneven part 250 in a surface except for a region where the surface electrode 30 is formed.

Uneven Part 250

The uneven part 250 is formed by roughening a surface of the electric current dispersing layer 240 opposite to the light emitting part 20. The uneven part 250 is formed so as to have a random shape by an etching treatment where a predetermined etchant is used. Also, the uneven part 250 can be formed so as to have a predetermined pattern in the surface. Further, it is preferable that in order to enhance a light extracting efficiency of the light emitting element 1, the uneven part 250 has an arithmetic average roughness Ra of not less than 0.04 μm and not more than 0.25 μm, and a square average roughness RMS of not less than 0.05 μm and not more than 0.35 μm. Further, it is preferable that the uneven part 250 has the maximum height Ry of not less than 1.0 μm and not more than 3.0 μm.

Surface Electrode 30 and Rear Surface Electrode 35

The surface electrode 30 is formed of a material brought into ohmic contact with the electric current dispersing layer 240. Particularly, the surface electrode 30 is formed so as to include at least one metal material for p-type electrode selected from the group consisting of Be, Zn, Ni, Ti, Pt, Al, Au. For example, the surface electrode 30 can be formed so as to have a laminated structure that AuBe, Ni and Au are stacked in this order from a side of the electric current dispersing layer 240. Further, the surface electrode 30 is disposed on a surface of the electric current dispersing layer 240 opposite to the intervening layer 230, namely, on a part of the light extracting surface of the light emitting element 1. And, as shown in FIG. 1C, on the top view of the light emitting element 1, the surface electrode 30 is formed so as to have a circular portion 30a of a almost circular shape and four leg portions 30b extending toward four corners of the light emitting element 1 from the circular portion 30a.

The rear surface electrode 35 is formed of a material brought into ohmic contact with the semiconductor substrate 10. Particularly, the rear surface electrode 35 is formed so as to include at least one metal material for n-type electrode selected from the group consisting of Ge, Ni, Ti, Pt, Al, Au. For example, the rear surface electrode 35 can be formed so as to have a laminated structure that AuGe, Ni and Au are stacked in this order from a side of the semiconductor substrate 10. Further, the rear surface electrode 35 is formed on almost the whole rear surface of the semiconductor substrate 10.

Modifications

The light emitting element 1 according to the first embodiment includes the buffer layer 200 on the semiconductor substrate 10, but a light emitting element according to a modification of the first embodiment can be formed so as not to include the buffer layer 200.

Also, the light emitting element 1 according to the first embodiment emits a light including a red color (for example, a light having a light emission wavelength of 630 nm band, but a wavelength of a light emitted from the light emitting element 1 is not particularly limited to this wavelength. The light emitting element 1 can be also formed so as to emit a light having a predetermined wavelength range by controlling a structure of the active layer 222. The light emitted from the active layer 222 includes lights having a wavelength range such as cardinal red, orange, yellow or green. Also, the light emitting part 20 included in the light emitting element 1 can be also formed of InAlGaN compound semiconductor including the active layer 222 for emitting a light of ultraviolet region, purple region, or blue region.

Further, the compound semiconductor layers of the semiconductor substrate 10, the buffer layer 200, the reflecting part 210, the first cladding layer 220, the second cladding layer 224, the intervening layer 230 and the electric current dispersing layer 240 included in the light emitting element 1 can have a conductivity type of compound semiconductors constituting the compound semiconductor layers opposite to the conductivity type of the first embodiment. For example, the conductivity type of the semiconductor substrate 10, the buffer layer 200, the reflecting part 210 and the first cladding layer 220 can be set to the p-type, and the conductivity type of the second cladding layer 224, the intervening layer 230 and the electric current dispersing layer 240 can be also set to the n-type.

In addition, the active layer 222 can be formed so as to have a quantum-well structure. The quantum-well structure can be formed of any of a single quantum-well structure, a multiple quantum-well structure or a strained multiple quantum-well structure. The light emitting part 20 can be formed so as to include semiconductor layers other than the first cladding layer 220, the active layer 222 and the second cladding layer 224.

Also, the surface electrode 30 can be formed so as to have a shape such as a rectangular shape, a diamond shape, a polygonal shape.

Method of Manufacturing the Light Emitting Element 1

The light emitting element 1 according to the first embodiment can be manufactured, for example, as follows. First, the semiconductor substrate 10 is prepared. And, a semiconductor laminated structure of III-V group compound semiconductor including a plurality of compound semiconductor layers (namely, the buffer layer 200, the reflecting part 210, the first cladding layer 220, the active layer 222, the second cladding layer 224, the intervening layer 230 and the electric current dispersing layer 240) is formed on the semiconductor substrate 10, for example, by a metal organic vapor phase epitaxy (MOVPE) method (growth process). Due to this, an epitaxial wafer can be manufactured.

Here, the formation of the semiconductor laminated structure using the MOVPE method is carried out under conditions that a growth temperature, a growth pressure, and each growth speed and each V/III ratio of the plural compound semiconductor layers included in the semiconductor laminated structure are respectively set to a predetermined value. Further, the V/III ratio means a molar ratio of V group materials such as arsine ($AsH_3$), phosphine ($PH_3$) to III group materials such as trimethylgallium (TMGa), trimethylaluminum (TMAl).

Also, an organic metal compound can be used as materials used in the MOVPE method. For example, trimethylgallium (TMGa) or triethylgallium (TEGa) as a Ga material, trimethylaluminum (TMAl) as an Al material, and trimethylindium (TMIn) as an In material can be respectively used. Additionally, arsine ($AsH_3$) as a As source, and hydride gas such as phosphine ($PH_3$) as a P source can be respectively used. Further, hydrogen selenide ($H_2Se$), disilane ($Si_2H_6$) can be used as a material for an n-type dopant. And, biscyclopentadienylmagnesium ($Cp_2Mg$) can be used as a material for a p-type dopant.

Additionally, monosilane ($SiH_4$), diethyltellurium (DETe) or dimethyltellurium (DMTe) can be also used as the material for the n-type dopant. And, dimethylzinc (DMZn) or diethylzinc (DEZn) can be also used as the material for the p-type dopant.

Further, by forming the buffer layer 200 on the semiconductor substrate 10, influence of dopant used at the last crystal growth (namely, influence of furnace memory) remaining in the MOVPE device can be cancelled. Due to this, an epitaxial wafer can be stably manufactured. Also, by epitaxially-growing the buffer layer 200 on the semiconductor substrate 10, crystallinity of the compound semiconductor layers epitaxially-grown on the buffer layer 200 can be enhanced.

Next, the surface electrode 30 is formed on a surface of the epitaxial wafer, namely, a part of a surface of the electric current dispersing layer 240 by using a photolithography method and a film formation method such as a vacuum deposition method, a sputtering method (surface electrode formation process). Further, a liftoff method can be used for forming the surface electrode 30. Subsequently, the rear surface electrode 35 is formed on almost the whole rear surface of the semiconductor substrate 10. Furthermore, an alloy treatment is carried out under a predetermined atmosphere, for example, under an inert atmosphere such as under nitrogen atmosphere, at a predetermined temperature and for a predetermined time, in order to bring the surface electrode 30 and the electric current dispersing layer 240, and the rear surface electrode 35 and the rear surface of the semiconductor substrate 10 into ohmic contact with each other.

Subsequently, an unevenness treatment, namely a roughening treatment is applied to a surface of the electric current dispersing layer 240, so as to form the uneven part 250 (uneven part formation process). In the embodiment, the roughening treatment is carried out after the surface electrode 30 has been formed. And, the roughening treatment is carried out on the surface of the electric current dispersing layer 240 except for a region where the surface electrode 30 is formed, by an etching treatment where a predetermined etchant is used. Further, it can be also adopted that a predetermined mask pattern is formed on the surface of the electric current dispersing layer 240 by using the photolithography method, and then the etching treatment is applied to the surface of the electric current dispersing layer 240 by using the mask pattern formed as a mask.

Next, the epitaxial wafer where the surface electrode 30 and the rear surface electrode 35 are formed is cut corresponding to a size of the light emitting element 1 to be manufactured, so as to manufacture a plurality of the light emitting element 1 (cutting process). Particularly, the areas among the plural surface electrode 30 are diced by a dicing device corresponding to a size of the light emitting element 1 to be manufactured. Further, after the dicing treatment, the etching treatment can be also applied to edge surfaces of the plural light emitting element 1 so as to remove mechanical damage due to the dicing treatment.

The light emitting element 1 manufactured as described above is, for example, a light emitting diode (LED) for emitting a light in a red region having a light emission wavelength adjacent to 631 nm. And, the light emitting element 1 has almost a rectangular shape, on the top view, and dimension on the top view is, as an example, square of 275 μm.

Advantages of the First Embodiment

The light emitting element 1 according to the first embodiment includes the reflecting part 210 having a plurality of pair layers formed of the first semiconductor layer 210a and the second semiconductor layer 210b whose thicknesses are controlled corresponding to a plurality of incident angles, so that even if a light enters into the reflecting part 210 at various incident angles, the reflecting part 210 can reflect the light toward a side of the light extracting surface. Further, the light emitting element 1 includes the uneven part 250 on the light extracting surface, so that the light reflected by the reflecting part 210 can be efficiently extracted outside of the light emitting element 1. Due to this, the light emitting element 1 having an enhanced light extracting efficiency can be provided. Furthermore, the light emitting element 1 according to the embodiment can increase the light emission output in accordance with increase in thickness of the reflecting part 210, by adjusting the composition of the plural semiconductor layers included in the reflecting part 210.

Also, the light emitting element 1 according to the first embodiment has the uneven part 250 formed on the light extracting surface so that it can effectively extract a light from the light extracting surface, even if the light is a light reflected by the pair layers having the first semiconductor layer 210a and the second semiconductor layer 210b whose thicknesses are defined by larger values of the angle θ of the formulae 1, 2. Due to this, the light emitting element 1 according to the first embodiment can enhance a light emission output in comparison with, for example, a case that the reflecting part 210 is formed of only semiconductor layers corresponding to a light emission peak wavelength of the light emitted from the active layer 222. Consequently, according to the embodiment, the light emitting element 1 having a high light emission output can be provided without increase in manufacturing cost caused by increase in materials and growth time due to increase in the total number of the compound semiconductor layers grown on the semiconductor substrate 10.

Second Embodiment

FIG. 2 is a cross-sectional view schematically showing a light emitting element according to a second embodiment of the invention.

The light emitting element 1a according to the second embodiment includes almost the same composition as the light emitting element 1 according to the first embodiment except for further including a light extracting layer 40 on the uneven part 250, difference from the light emitting element 1 according to the first embodiment. Therefore, detail explanation will be omitted except for the different points.

The light emitting element 1a includes the light extracting layer 40 formed on the surface of the electric current dispersing layer 240 except for a region where the surface electrode 30 is formed so as to be formed of a material being transparent to the light emitted from the active layer 222 and having refractive index at the level intermediate between the semiconductor constituting the electric current dispersing layer 240 and air. The light extracting layer 40 is formed so as to have a thickness d that is ranged within ±30% of a value defined by a formula $A \times \lambda_P/(4 \times n)$, if wavelength of the light emitted from the active layer 222 is $\lambda_P$, refractive index of the material constituting the light extracting layer 40 is η and A is a constant number, where A is odd numbers.

The light extracting layer 40 can be formed of an insulating material, or a first or second conductivity type oxide or nitride. The light extracting layer 40 can be formed of, for example, an oxide or nitride such as SiN, $SiO_2$, ITO, $Sn_2O_3$, $TiO_2$, ZnO. Further, a material constituting the light extracting layer 40 is not needed to have electrical conductivity. Furthermore, the material constituting the light extracting layer 40 can have any of the p-type and the n-type conductivity.

The light emitting element 1a includes the light extracting layer 40 formed between the surface of the electric current dispersing layer 240 and outside air and having refractive index at the level intermediate between the semiconductor constituting the electric current dispersing layer 240 and the air, so as to further enhance a light extracting efficiency of the light emitting element 1a.

Third Embodiment

FIG. 3 is a cross-sectional view schematically showing a light emitting element according to a third embodiment of the invention.

The light emitting element 1b according to the third embodiment includes almost the same composition as the light emitting element 1 according to the first embodiment except that the active layer 222 is sandwiched between a first undoped layer 221 and a second undoped layer 223, difference from the light emitting element 1 according to the first embodiment. Therefore, detail explanation will be omitted except for the different points.

Particularly, the light emitting element 1b according to the third embodiment includes the semiconductor substrate 10, the buffer layer 200 disposed on the semiconductor substrate 10, the reflecting part 210 disposed on the buffer layer 200, a first cladding layer 220 disposed on the reflecting part 210, the first undoped layer 221 disposed on the first cladding layer 220, the active layer 222 disposed on the first undoped layer 221, the second undoped layer 223 disposed on the active layer 222, the second cladding layer 224 disposed on the second undoped layer 223, an intervening layer 230 disposed on the second cladding layer 224, and a electric current dispersing layer 240 disposed on the intervening layer 230.

The first undoped layer 221 prevents an n-type dopant in the first cladding layer 220 from dispersing into the active layer 222. Also, the second undoped layer 223 prevents a p-type dopant in the second cladding layer 224 from dispersing into the active layer 222. The first undoped layer 221 and the second undoped layer 223 are formed of, for example, $(Al_xGa_{1-x})_yIn_{1-y}P$ containing no dopants. The active layer 222 is sandwiched between the first undoped layer 221 and the second undoped layer 223, so as to prevent dopants from dispersing into the active layer 222 from the first cladding layer 220 and the second cladding layer 224, consequently, light emission efficiency in the light emitting part 20a can be enhanced and durability of the light emitting element 1b can be enhanced.

Further, the light emitting element 1b according to the third embodiment is designed to have a structure that the active layer 222 is sandwiched between the first undoped layer 221 and the second undoped layer 223, but modification of the third embodiment can be also designed as a light emitting element having a structure that any one of the first undoped layer 221 and the second undoped layer 223 is not formed.

EXAMPLES

Example 1

A light emitting element that corresponds to the light emitting element 1 according to the first embodiment and emits a red light having a light emission wavelength adjacent to 631 nm was manufactured as a light emitting element according to Example 1. Particularly, first, a buffer layer formed of an n-type GaAs (doped with Se, and having a carrier concentration of $1\times10^{18}/cm^3$ and film thickness of 200 nm) and a reflecting part including pair layers formed of an AlAs layer as the first semiconductor layer 210a and an $Al_{0.5}Ga_{0.5}As$ layer as the second semiconductor layer 210b were epitaxially-grown by using the MOVPE method on an n-type GaAs substrate having an off angle of 15° off as the semiconductor substrate 10. Each semiconductor layer constituting the reflecting part 210 was controlled to have a carrier concentration of almost $1\times10^{18}/cm^3$. Further, nine different light emitting elements respectively having the reflecting part 210 that was variously changed in the composition were manufactured as the light emitting elements according to Example 1 as described below. Details of the composition of the reflecting part 210 will be described later.

Next, on the reflecting part 210, an n-type $(Al_{0.7}Ga_{0.3})_{0.5}In_{0.5}P$ cladding layer (doped with Se, and having a carrier concentration of $4\times10^{17}/cm^3$ and a film thickness of 400 nm) as the n-type first cladding layer 220, an undoped $(Al_{0.7}Ga_{0.3})_{0.5}In_{0.5}P$ active layer having a film thickness of 600 nm as the active layer 222, a p-type $(Al_{0.7}Ga_{0.3})_{0.5}In_{0.5}P$ cladding layer (doped with Mg, and having a carrier concentration of $2\times10^{17}/cm^3$ and a film thickness of 500 nm) as the second cladding layer 224, a p-type $Ga_{0.7}In_{0.3}P$ intervening layer (doped with Mg, and having a carrier concentration of $6\times10^{18}/cm^3$ and a film thickness of 20 nm) as the intervening layer 230, and a p-type GaP electric current dispersing layer (doped with Mg, and having a carrier concentration of $2\times10^{18}/cm^3$ and a film thickness of 8000 nm) as the electric current dispersing layer 240 were epitaxially grown in series. As described above, an epitaxial wafer for the light emitting element according to Example 1 was manufactured.

Further, as to a growth temperature in the MOVPE growth, a growth temperature of an n-type GaAs buffer layer to a p-type $Ga_{0.7}In_{0.3}P$ intervening layer was set to 650 degrees C., and a growth temperature of a p-type GaP electric current dispersing layer was set to 675 degrees C. Also, as to the other growth conditions, a growth pressure was set to 6666.1 Pa (50 Torr), and each growth speed of a plurality of compound semiconductor layers was set from 0.3 nm/sec to 1.5 nm/sec. And, a V/III ratio was set to almost 150. However, the V/III ratio in the growth of the p-type GaP electric current dispersing layer was set to 25. Since materials and the like used in the MOVPE growth have been already explained in the first embodiment, detail explain will be omitted.

Here, the reflecting part 210 will be explained in detail. A thickness of an AlAs layer of the first semiconductor layer 210a and a thickness of an $Al_{0.5}Ga_{0.5}As$ layer of a plurality of the pair layers included in the reflecting part 210 are respectively controlled to a thickness calculated by the formulae 1, 2. Namely, "631 nm" of light emission peak wavelength of a light emitted from an $(Al_{0.1}Ga_{0.9})_{0.5}In_{0.5}P$ active layer was used as $\lambda_P$, "3.114" of refractive index of an AlAs layer was used as $n_A$, "3.507" of refractive index of an $Al_{0.5}Ga_{0.5}As$ layer was used as $n_B$ and "3.127" of refractive index of an n-type $(Al_{0.7}Ga_{0.3})_{0.5}In_{0.5}P$ cladding layer was used as $n_{In}$. Further, 0°, 10°, 20°, 30°, 40°, 50°, 60° and 70° were used as the angle θ in the formulae (1), (2).

Furthermore, any of the AlAs layer and the $Al_{0.5}Ga_{0.5}As$ layer in a certain pair layer has a thickness calculated by using the same value of the angle θ in the formulae (1), (2). And, although the detail will be described below, the reflecting part 210 includes at least one pair layer that has the angle θ of 70° and at least two kinds of pair layers that do not have the angle θ of 70°. For example, the reflecting part 210 is formed so as to include three kinds of pair layers that have the angle θ of 10°, 40° and 70°.

Particularly, the thicknesses of the AlAs layer and the $Al_{0.5}Ga_{0.5}As$ layer and the pair number of the pair layer were determined by changing the value of θ in the formulae (1), (2) so that the whole thickness of the reflecting part 210 became almost 1.0 μm (Example 1a), 1.5 μm (Example 1b), 2.0 μm (Example 1c), 3.0 μm (Example 1d), 4.0 μm (Example 1e), 5.0 μm (Example 1f), 6.0 μm (Example 1g), 7.0 μm (Example 1h), and 8.0 μm (Example 1i). Table 1 shows a relationship among the value of θ in the formulae 1, 2, the thickness of the reflecting part 210 and the pair number of the pair layer.

TABLE 1

| | | Example 1 | | | | | | | | |
|---|---|---|---|---|---|---|---|---|---|---|
| | | Example 1a | Example 1b | Example 1c | Example 1d | Example 1e | Example 1f | Example 1g | Example 1h | Example 1i |
| | | Thickness of reflecting part 210 (nm) | | | | | | | | |
| | | 1001 | 1435 | 1991 | 2972 | 3960 | 4922 | 5966 | 6960 | 7982 |
| | | Number of pair layers | | | | | | | | |
| (°) | 0 | 2 | 1 | 1 | 4 | 4 | 4 | 3 | — | 7 |
| | 10 | 3 | 1 | 3 | — | 1 | 1 | 5 | 9 | — |
| | 20 | 1 | 4 | 6 | 5 | 6 | 8 | 9 | 8 | 13 |

TABLE 1-continued

| | Example 1 | | | | | | | | |
|---|---|---|---|---|---|---|---|---|---|
| | Example 1a | Example 1b | Example 1c | Example 1d | Example 1e | Example 1f | Example 1g | Example 1h | Example 1i |
| | Thickness of reflecting part 210 (nm) | | | | | | | | |
| | 1001 | 1435 | 1991 | 2972 | 3960 | 4922 | 5966 | 6960 | 7982 |
| | Number of pair layers | | | | | | | | |
| 30 | 1 | 1 | 2 | 3 | 2 | 6 | 5 | 10 | 11 |
| 40 | — | 1 | — | — | 6 | 3 | 6 | 9 | 8 |
| 50 | — | 1 | 1 | 2 | 2 | 4 | 5 | 5 | 1 |
| 60 | 1 | — | 1 | 2 | 3 | 4 | 3 | 6 | 11 |
| 70 | 1 | 2 | 2 | 3 | 3 | 4 | 4 | 4 | 4 |
| 80 | — | — | — | 1 | 1 | 1 | 2 | 1 | 2 |

Further, as to an epitaxial wafer for light emission element including the reflecting part 210 having a thickness of almost 2.0 μm, one more epitaxial wafer was manufactured (hereinafter referred to as Example 1j), the epitaxial wafer having a composition that kinds of the first semiconductor layer 210a and the second semiconductor layer 210b included in the reflecting part 210 are the same as those of Example 1c, but the lamination order is reversed so as to be opposite to that of Example 1c.

Composition of Reflecting Part 210

Figure 4A:
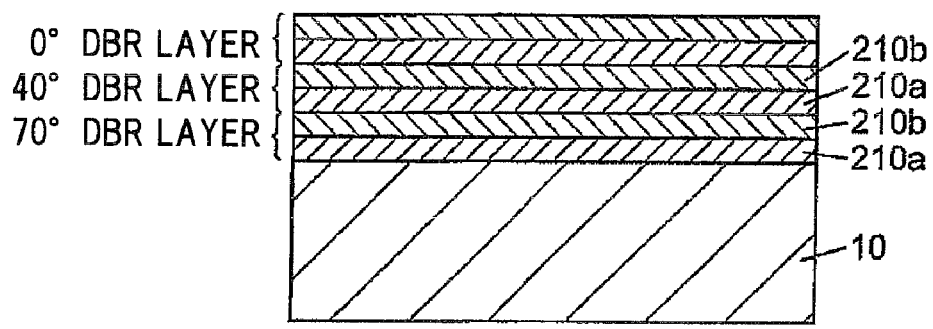
FIG. 4A is a cross-sectional view schematically showing a simplified structure of the reflecting part included in the light emitting element according to Example 1 of the invention.
Figure 4B:
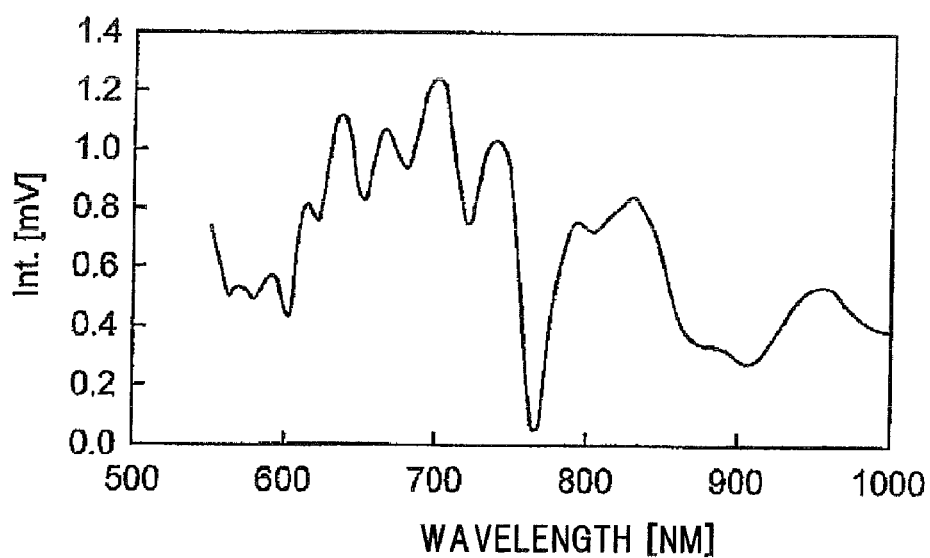
FIG. 4B is a graph schematically showing a reflectance spectrum in the simplified structure of the reflecting part included in the light emitting element according to Example 1 of the invention.

FIG. 4A is a cross-sectional view schematically showing a simplified structure of the reflecting part included in the light emitting element according to Example 1 of the invention, and FIG. 4B is a graph schematically showing a reflectance spectrum in the simplified structure of the reflecting part included in the light emitting element according to Example 1 of the invention. And, FIG. 5A is a cross-sectional view schematically showing a simplified structure of the reflecting part included in the light emitting element having a 0° DBR layer and FIG. 5B is a graph schematically showing a reflectance spectrum in the simplified structure of the reflecting part included in the light emitting element having a 0° DBR layer.

As seen from referring to FIG. 4A, the simplified structure of the reflecting part 210 included in the light emitting element according to Example includes a 70° DBR layer, a 40° DBR layer and a 0° DBR layer formed on an n-type GaAs substrate as the semiconductor substrate 10 in this order. When a reflectance spectrum in the reflecting part 210 having the above-mentioned structure was measured, as shown in FIG. 4B, it was shown that the reflecting part 210 is capable of reflecting lights which have various wavelengths.

Figure 5A:
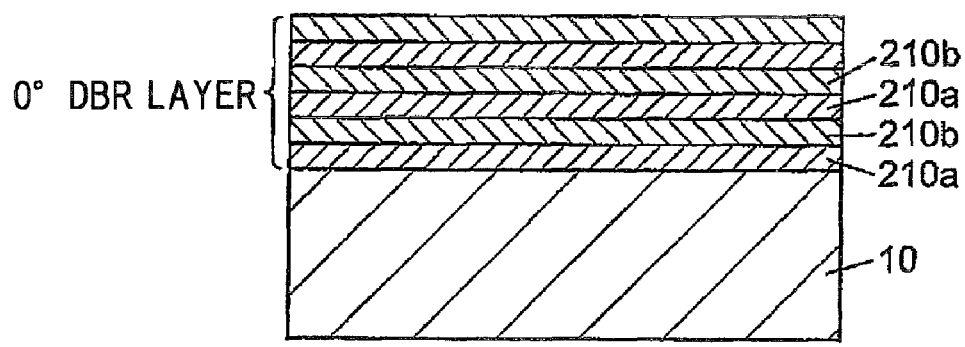
FIG. 5A is a cross-sectional view schematically showing a simplified structure of the reflecting part included in the light emitting element having a 0° DBR layer.
Figure 5B:
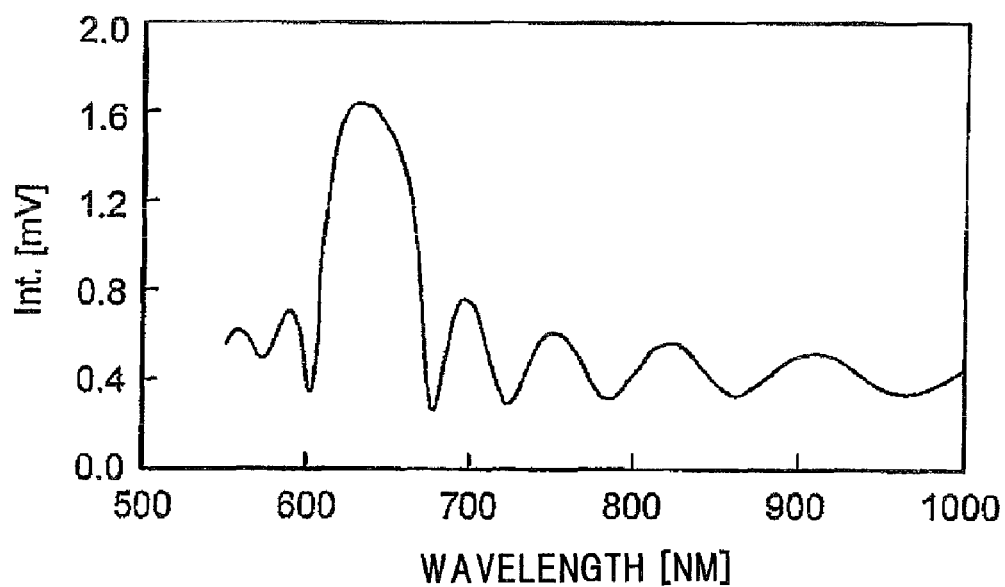
FIG. 5B is a graph schematically showing a reflectance spectrum in the simplified structure of the reflecting part included in the light emitting element having a 0° DBR layer.

On the other hand, as seen from referring to FIG. 5A, the simplified structure of the reflecting part included in the light emitting element according to Comparative Example includes three 0° DBR layers formed on the n-type GaAs substrate as the semiconductor substrate 10. When a reflectance spectrum in the reflecting part having the above-mentioned structure was measured, as shown in FIG. 5B, it was shown that the reflecting part mainly reflects only a light which has a peak wavelength of adjacent to 640 nm.

Example 1c

Here, taking a case that the reflecting part 210 has a thickness of almost 2.0 μm, namely a case of Example 1c, as an example, a structure of the reflecting part 210 will be explained. The other Examples are exactly as shown in Table 1.

The structure of the reflecting part 210 according to Example 1c is as described below. Namely, first, two pairs of pair layer (hereinafter referred to as 70° DBR layer) of an AlAs layer and an $Al_{0.5}Ga_{0.5}As$ layer having thicknesses calculated from the formulae (1), (2) by setting θ to 70° were formed on an n-type GaAs buffer layer. Next, a pair of pair layer (hereinafter referred to as 60° DBR layer) of the AlAs layer and the $Al_{0.5}Ga_{0.5}As$ layer having thicknesses calculated from the formulae (1), (2) by setting θ to 60° was formed on the 70° DBR layer. And, a pair of pair layer (hereinafter referred to as 50° DBR layer) of the AlAs layer and the $Al_{0.5}Ga_{0.5}As$ layer having thicknesses calculated from the formulae (1), (2) by setting θ to 50° was formed on the 60° DBR layer.

Further, two pairs of pair layer (hereinafter referred to as 30° DBR layer) of the AlAs layer and the $Al_{0.5}Ga_{0.5}As$ layer having thicknesses calculated from the formulae (1), (2) by setting θ to 30° were formed on the 50° DBR layer. And, six pairs of pair layer (hereinafter referred to as 20° DBR layer) of the AlAs layer and the $Al_{0.5}Ga_{0.5}As$ layer having thicknesses calculated from the formulae (1), (2) by setting θ to 20° were formed on the 30° DBR layer.

Furthermore, three pairs of pair layer (hereinafter referred to as 10° DBR layer) of the AlAs layer and the $Al_{0.5}Ga_{0.5}As$ layer having thicknesses calculated from the formulae (1), (2) by setting θ to 10° were formed on the 20° DBR layer. And, a pair of pair layer (hereinafter referred to as 0° DBR layer) of the AlAs layer and the $Al_{0.5}Ga_{0.5}As$ layer having thicknesses calculated from the formulae (1), (2) by setting the θ to 0° was formed as the top layer on the 10° DBR layer. The reflecting part 210 having sixteen pairs of pair layer described above was formed on the n-type GaAs buffer layer.

Further, the epitaxial wafer according to Example 1j includes the reflecting part 210 having the following composition, Example 1j having a structure that kinds of the first semiconductor layer 210a and the second semiconductor layer 210b included in the reflecting part 210 as to the epitaxial wafer for light emitting element of Example 1c are the same as those of Example 1c, but the lamination order is reversed so as to be opposite to that of Example 1c. Namely, a pair of the 0° DBR layer on an n-type GaAs buffer layer, three pairs of the 10° DBR layer on the 0° DBR layer, six pairs of the 20° DBR layer on the 10° DBR layer, two pairs of the 30° DBR layer on the 20° DBR layer, a pair of the 50° DBR layer on the 30° DBR layer, a pair of the 60° DBR layer on the 50° DBR layer, and two pairs of the 70° DBR layer on the 60° DBR layer were included. Due to this, ten kinds of epitaxial wafers according to Example 1a to Example 1j were manufactured.

After the ten kinds of epitaxial wafers for light emitting element manufactured as seen from the above were carried out from the MOVPE device, the surface electrodes 30 having a circular portion of 100 μm in diameter and four leg portions extending from an outer edge of the circular portion were respectively formed on the surface of epitaxial wafer (namely, on the upper surface of epitaxial wafer and on the surface of electric current dispersing layer 240) so as to be arranged in matrix state. The surface electrodes 30 were formed by using the photolithography method. Namely, after photoresist was coated on the surface of the epitaxial wafer, a mask pattern was formed on the surface of epitaxial wafer by the photolithography method using a mask aligner, the mask pattern having an opening in each of the regions where a plurality of surface electrodes 30 are to be formed. After that, AuBe of 40 nm in thickness, Ni of 10 nm in thickness, and Au of 1000 nm in thickness were deposited on the opening in this order by using the vacuum deposition method. After the deposition, the mask pattern formed on the epitaxial wafer was removed by the liftoff method, so that the surface electrodes 30 were formed on the surface of epitaxial wafer.

Next, the rear surface electrode 35 was formed by using the vacuum deposition method on the whole surface of the rear surface of epitaxial wafer, namely, a surface opposite to the surface where the surface electrodes 30 were formed. The rear surface electrode 35 was formed by depositing AuBe of 60 nm in thickness, Ni of 10 nm in thickness, and Au of 500 nm in thickness in this order. After the surface electrodes 30 and the rear surface electrode 35 were formed, an alloying process of alloying the electrodes was carried out. Particularly, it was carried out by heating at 400 degrees C. for 5 minutes under nitrogen gas atmosphere the epitaxial wafer where the surface electrodes 30 and the rear surface electrode 35 were formed.

Due to this, the epitaxial wafers with electrodes for light emitting element according to Examples 1a to 1j were manufactured.

Subsequently, the roughening treatment was applied to the surface of electric current dispersing layer 240 of the epitaxial wafers with electrodes for light emitting element according to Examples 1a to 1j in the regions except for the surface electrodes 30. The roughening treatment was carried out by etching the surface of electric current dispersing layer 240 by using an acetic acid based etchant. The etching time was set to for 30 seconds.

Also, a relationship between the etching time and the unevenness of the surface was investigated by using the epitaxial wafers according to Examples 1a to 1j. The etching time adopted in the investigation was 15 seconds, 30 seconds, 60 seconds and 90 seconds.

Figure 6:
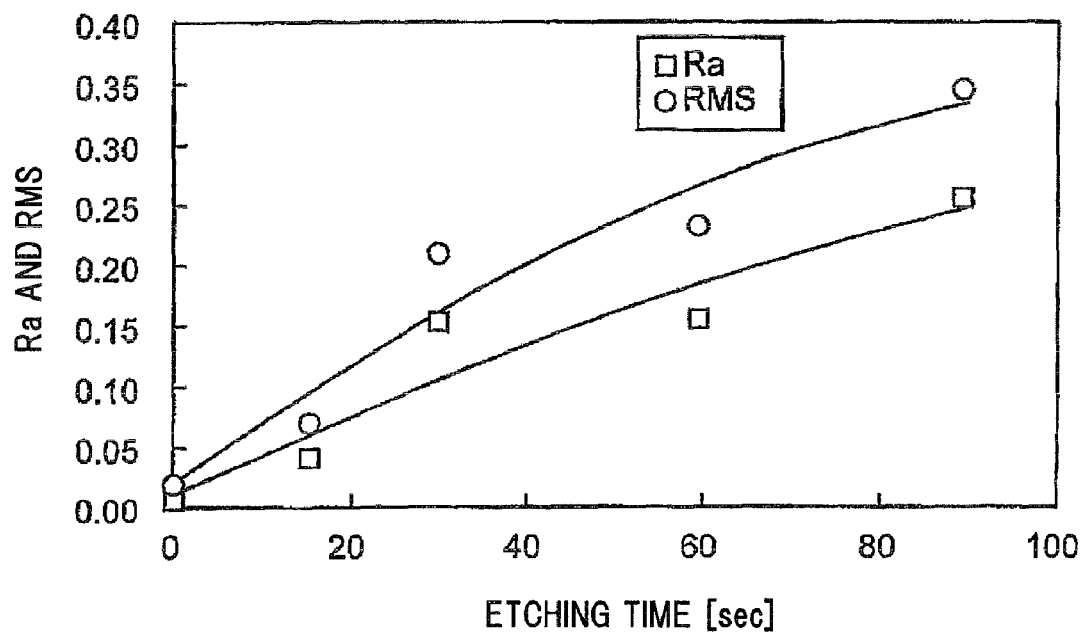
FIG. 6 is a graph schematically showing a relationship between an etching time and a surface roughness (particularly, Ra and RMS) at the time of applying a roughening treatment to an epitaxial wafer used in Example 1.
Figure 7:
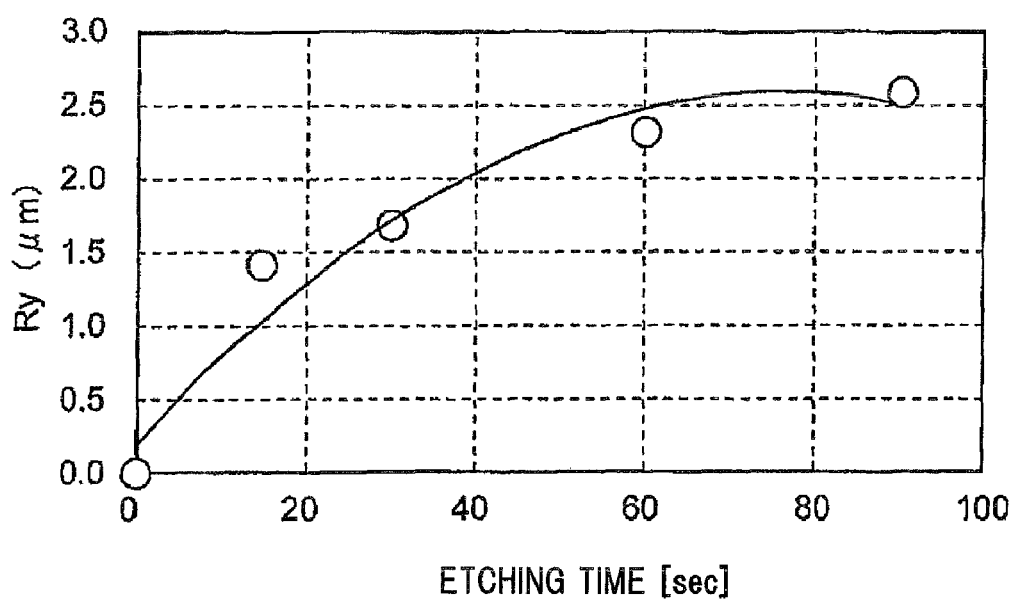
FIG. 7 is a graph schematically showing a relationship between an etching time and a surface roughness (particularly, Ry) at the time of applying a roughening treatment to an epitaxial wafer used in Example 1.

FIG. 6 is a graph schematically showing a relationship between an etching time and a surface roughness (particularly, Ra and RMS) at the time of applying a roughening treatment to an epitaxial wafer used in Example 1, and FIG. 7 is a graph schematically showing a relationship between an etching time and a surface roughness (particularly, Ry) at the time of applying a roughening treatment to an epitaxial wafer used in Example 1.

Referring to FIG. 6, an average surface roughness Ra of the uneven part 250 formed on the surface of electric current dispersing layer 240 was 0.04 to 0.25 μm and a square average roughness RMS of the uneven part 250 was 0.05 to 0.35 μm. Also, referring to FIG. 7, the maximum height Ry of the uneven part 250 was 1.4 to 2.6 μm.

After the electrodes were formed on the epitaxial wafers, each of the epitaxial wafers with electrodes according to Examples 1a to 1j was cut by a dicing device so that the surface electrode 30 is located at the center, and each of the light emitting elements (hereinafter referred to as LED bear chips) having a chip size of 275 μm square according to Examples 1a to 1j was manufactured. And, the LED bear chips were die-bonded to a TO-18 stem by using an Ag paste. Also, the surface electrode 30 of the LED bear chips mounted on the TO-18 stem was wire-bonded by using a wire of Au, and each of the light emitting elements according to Examples 1a to 1j was manufactured.

Table 2 shows a result of evaluating initial characteristics of the light emitting elements according to Examples 1a to 1j manufactured as described above. Further, the light emitting element taken out from adjacent to the center of the epitaxial wafer was respectively used for the evaluation. Furthermore, the light emission output in Table 2 means a light emission output obtained when electrical current of 20 mA was applied.

TABLE 2

| | Example 1 | | | | | | | | |
|---|---|---|---|---|---|---|---|---|---|
| | Example 1a | Example 1b | Example 1c | Example 1d | Example 1e | Example 1f | Example 1g | Example 1h | Example 1i |
| Thickness of reflecting part 210 (nm) | 1001 | 1435 | 1991 | 2972 | 3960 | 4922 | 5966 | 6960 | 7982 |
| Light emission output (mW) | 2.104 | 2.592 | 2.832 | 3.453 | 4.050 | 4.28 | 4.554 | 4.648 | 4.631 |
| Forward voltage (V) | 1.874 | 1.875 | 1.876 | 1.875 | 1.879 | 1.880 | 1.879 | 1.879 | 1.880 |
| Light emission peak wavelength (nm) | 634.0 | 634.5 | 634.3 | 634.4 | 634.8 | 634.2 | 635.0 | 634.5 | 635.1 |

Figure 8:
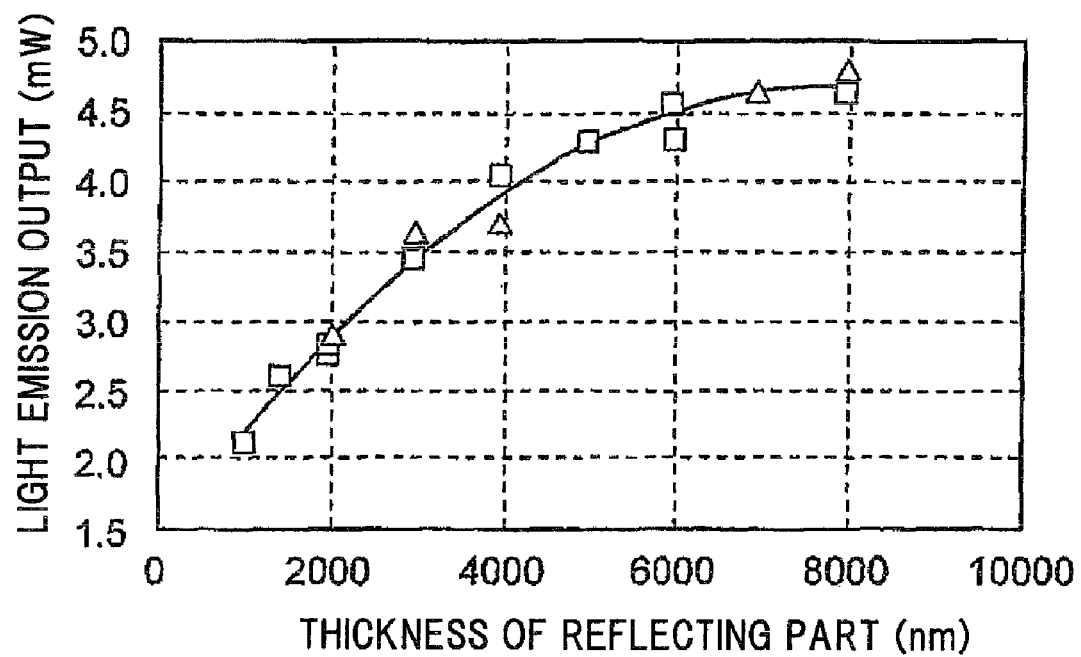
FIG. 8 is a graph schematically showing a relationship between a thickness of reflecting part and a light emission output of Examples 1a to 1j.

FIG. 8 is a graph schematically showing a relationship between a thickness of reflecting part and a light emission output of Examples 1a to 1j. Here, in FIG. 8, a mark of square and a mark of triangle are different from each other in a point that they respectively show an experiment period different from each other (however, the same manufacturing equipment was used for manufacturing the light emitting elements). Namely, the light emission outputs of the light emitting elements according to Examples manufactured at a first period were shown by the mark of square and the light emission outputs of the light emitting elements according to Examples manufactured at a second period different from the first period were shown by the mark of triangle. Further, in the first period, a plurality of light emission outputs were shown on the same axis of a thickness of the reflecting part 210 (for example, in case that the thickness of the reflecting part 210 is 2000 nm etc.), but this is due to the fact that reproducibility was confirmed at the same period by the same device. Furthermore, values shown in Table 2 are representative values.

Referring to FIG. 8, it was shown that the light emission output of the light emitting elements according to Examples 1a to 1j is enhanced as the thickness of the reflecting part 210 is increased. Especially, it was shown that the light emission output of the light emitting element is increased until the thickness of the reflecting part 210 reaches almost 8000 nm, namely almost 8 µm. Particularly, the light emission output is drastically increased until the thickness of the reflecting part 210 reaches almost 6 µm, and the light emission output is further increased when the thickness of the reflecting part 210 is located between almost 6 µm and almost 8 µm. Further, in Comparative Example described below, the light emission output is not be increased so as to be saturated when the thickness of the reflecting part 210 becomes not less than 2000 nm, namely almost 2 µm.

Particularly, the light emission output of the light emitting element according to Comparative Example is almost 2.0 mW, but the light emission output of the light emitting element according to Example 1 is almost 2.1 to 4.6 mW, consequently, it was shown that the light emitting element according to Example 1 can be manufactured by which the light emission output can be obtained, that is not less than two times the light emission output of the light emitting element according to Comparative Example. Namely, it was shown that in the light emitting element according to Example 1, for example, in light emitting elements according to Examples 1g to 1i, the light emission output of 4.5 mW-class can be obtained. Also, it was shown that the light emission output of 4.5 mW-class can be reproducibly obtained regardless of the manufacturing period.

Further, it was confirmed that the light emission output of the light emitting element manufactured by setting the etching time for roughening the surface of the electric current dispersing layer 240 to 15 seconds, 30 seconds, 60 seconds and 90 seconds was also almost the same as that of Example 1. Due to this, it was shown that if the surface of the electric current dispersing layer 240 is roughened by setting the etching time to 15 seconds to 90 seconds, the average roughness Ra is 0.04 µm to 0.25 µm, the square average roughness RMS is 0.05 µm to 0.35 µm, and the maximum height Ry is 1.4 µm to 2.6 µm, the light emission output similar to that of Example 1 can be obtained.

Also, referring to Table 2, regardless of the composition of the reflecting part 210 and existence of the uneven part 250, the peak wavelength is within the range of ±1 nm, and it was shown that there is practically no problem. Further, with regard to forward voltage Vf, it was also shown that there is practically no problem.

In addition, with regard to the light emitting elements according to Example 1, reliability test was carried out. Particularly, the reliability test was evaluated by carrying out energization test for 168 hours under conditions of room temperature and 50 mA power distribution. As a result of the reliability test, in any of the light emitting elements according to Example 1, relative output was 96% to 105%. The relative output was calculated by a formula of (a light emission output after 168 hours power distribution/an initial light emission output)×100. Consequently, it was confirmed that the light emitting element according to Example 1 is comparable in reliability to the light emitting element according to Comparative Example described below. Further, evaluation electric current value is 20 mA both before and after 50 mA power distribution.

Also, the light emission output of the light emitting element according to Example 1j, namely the light emitting element having a structure where the composition of the reflecting part 210 of Example 1c is reversed was 2.7775 mW, and it was almost 98% of the light emission output of Example 1c. It is considered that the difference of the abovementioned 2% is variation among elements. And, the light emitting element according to Example 1j has the light emission peak wavelength, the forward voltage and the reliability almost equal to the light emitting element according to Example 1c. Therefore, it was shown that there is practically no problem even if the lamination order of the pair layers constituting the reflecting part 210 is reversed. This is due to the fact that materials constituting the reflecting part 210 are formed of materials transparent to a light emitted from the active layer 222.

Example 2

As a light emitting element according to Example 2, a light emitting element including an electric current dispersing layer different from that of the light emitting element according to Example 1 was manufactured. The light emitting element according to Example 2 includes almost the same composition and function as the light emitting element of Example 1 except for the composition of the electric current dispersing layer, so that a detail explanation will be omitted except for the different points.

Figure 9:
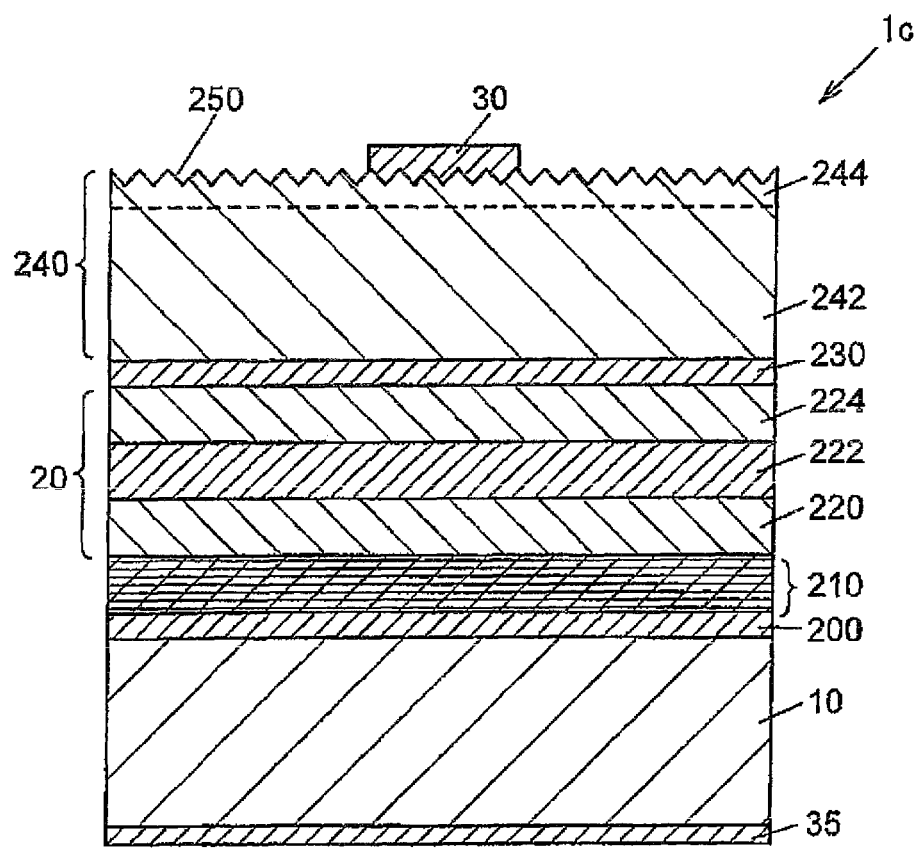
FIG. 9 is a cross-sectional view schematically showing a light emitting element according to Example 2.

FIG. 9 is a cross-sectional view schematically showing a light emitting element according to Example 2.

The light emitting element 1c according to Example 2 includes a semiconductor substrate 10, a buffer layer 200 disposed on the semiconductor substrate 10, a reflecting part 210 disposed on the buffer layer 200, a first cladding layer 220 disposed on the reflecting part 210, an active layer 222 disposed on the first cladding layer 220, a second cladding layer 224 disposed on the active layer 222, an intervening layer 230 disposed on the second cladding layer 224, and a current dispersing layer 240 having a first electric current dispersing layer 242 and a second electric current dispersing layer 244 disposed on the intervening layer 230. Also, the light emitting element 1c further includes a surface electrode 30 disposed on the second electric current dispersing layer 244, namely on an uneven part 250, and a rear surface electrode 35 disposed on a surface of the semiconductor substrate 10 opposite to the reflecting part 210.

The reflecting part 210 used in Example 2 has a thickness of 2972 nm and has the same composition as that of the reflecting part 210 of Example 1d shown in Table 1. On the other hand, the electric current dispersing layer 240 is formed so as to have the first electric current dispersing layer 242 and the second electric current dispersing layer 244 that have carrier concentration or impurity concentration different from each other. And, the second electric current dispersing layer 244 is formed in a surface side of the electric current dispersing layer 240 so as to have the carrier concentration or the impurity concentration higher than the first electric current dispersing layer 242.

$Cp_2Mg$ flow rate (Mg flow rate) in case of growing the electric current dispersing layer 240, particularly, the first electric current dispersing layer 242 was set to 68 sccm so that the carrier concentration of the first electric current dispersing layer 242 becomes $2\times10^{18}/cm^3$. Also, with regard to a part corresponding to the uppermost 2000 nm (namely, a part corresponding to the second electric current dispersing layer 244) of 8000 nm that is a thickness of the electric current dispersing layer 240, the second electric current dispersing layer 244 was grown by setting the Mg flow rate to almost two times Mg flow rate in case of growing the first electric current dispersing layer 242 (namely, 135 sccM) so that the carrier concentration of the second electric current dispersing layer 244 becomes $4\times10^{18}/cm^3$. Further, it is preferable that the second electric current dispersing layer 244 has a thickness of not less than 1.0 μm and not more than 3.0 μm.

Also, in Example 2, the uneven part 250 was formed on the surface of the second electric current dispersing layer 244 before the surface electrode 30 is formed. In case of the light emitting element that does not have the second electric current dispersing layer 244 as Example 1, when the uneven part 250 was formed on the surface of the electric current dispersing layer 240 before the surface electrode 30 is formed, the forward voltage was heightened. However, in case of the light emitting element 1c according to Example 2, since it includes the second electric current dispersing layer 244, it was shown that the light emitting element 1c has a LED property almost similar to the light emitting element according to Example 1.

Example 3

As a light emitting element according to Example 3, a reflecting part 210 different from that of the light emitting element according to Example 1d was manufactured. The light emitting element according to Example 3 includes almost the same composition and function as the light emitting element of Example 1d except for the composition of the reflecting part 210, so that a detail explanation will be omitted except for the different points.

Figure 10:
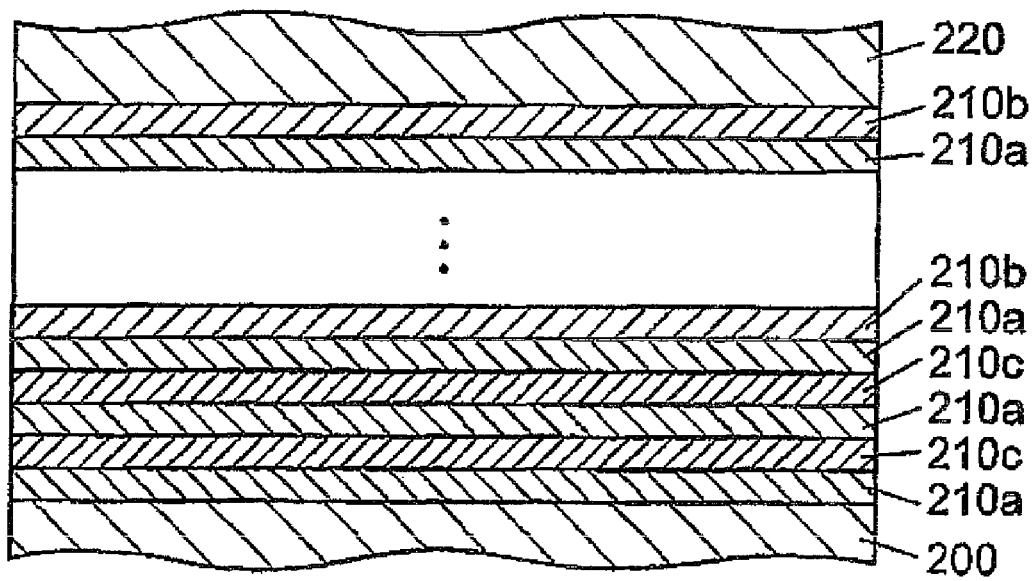
FIG. 10 is a cross-sectional view schematically showing a light emitting part of a light emitting element according to Example 3.

FIG. 10 is a cross-sectional view schematically showing a light emitting part of a light emitting element according to Example 3.

In the reflecting part 210 of the light emitting element according to Example 3, a second semiconductor substrate 210c constituting the 0° DBR layer was formed of GaAs that is a semiconductor material opaque to the light emitted from the active layer 222. Particularly, the composition of the light emitting element according to Example 3 is as follows. Namely, two pairs of the 0° DBR layer (these two pairs of 0° DBR layer was formed of a GaAs based semiconductor) on an n-type GaAs buffer layer, a pair of 80° DBR layer on the 0° DBR layer, three pairs of the 70° DBR layer on the 80° DBR layer, two pairs of the 60° DBR layer on the 70° DBR layer, two pairs of the 50° DBR layer on the 60° DBR layer, three pairs of the 30° DBR layer on the 50° DBR layer, five pairs of the 20° DBR layer on the 30° DBR layer, and two pairs of the 0° DBR layer (these two pairs of 0° DBR layer was formed of a AlGaAs based semiconductor) on the 20° DBR layer were formed. Also, in the respective two pairs of the 0° DBR layer formed on the n-type GaAs buffer layer, the second semiconductor substrate 210c was formed of GaAs. On the other hand, a second semiconductor substrate 210b of two pairs of the 0° DBR layer contacting the first cladding layer 220 was formed of an $Al_{0.5}Ga_{0.5}As$ layer. Namely, in the light emitting element according to Example 3, the respective layers were formed so as to have a structure of the first cladding layer 220/two pairs of the 0° DBR layer (in this regard, formed of the AlGaAs based semiconductor)/ . . . /two pairs of the 0° DBR layer (in this regard, formed of the GaAs based semiconductor)/the buffer layer 200. The first semiconductor substrate 210a of each of the pair layers and the second semiconductor substrate 210b of the other DBR layers except for the 0° DBR layer are formed of the same materials as those of Example 1d.

The light emission output of the light emitting element according to Example 3 was 3.63 mW. Namely, the light emission output was enhanced about 5% than the light emission output of the light emitting element according to Example 1d. Further, the light emitting element according to Example 3 has the forward voltage, the light emission wavelength and the reliability almost equal to the light emitting element according to Example 1d.

The light emission output of the light emitting element according to Example 3 was enhanced than the light emitting element according to Example 1d. This is due to the fact that a refractive index difference between a refractive index of the first semiconductor substrate 210a of the reflecting part 210 formed of AlAs and a refractive index of the second semiconductor substrate 210c formed of GaAs is larger than a refractive index difference between a refractive index of the first semiconductor substrate 210a formed of AlAs and a refractive index of the second semiconductor substrate 210b formed of $Al_{0.5}Ga_{0.5}As$, so that reflectance of the reflecting part 210 was enhanced. Further, the layer formed of GaAs absorbs a light emitted from the active layer 222. Therefore, if all of the second semiconductor substrates of the reflecting part 210 are formed of GaAs, the light emission output of the light emitting element is lowered. Consequently, it is preferable that the layer formed of GaAs is formed in the bottom layer of the reflecting part 210, namely, a pair layer formed at a location most away from the active layer 222. This is due to the fact that if the number of the pair layers included in the reflecting part 210 is not increased, in the bottom layer of the reflecting part 210, consideration for increasing the refractive index provides a larger effect of increasing the light emission output than consideration for decreasing the light absorption.

Comparative Example 1

Figure 11:
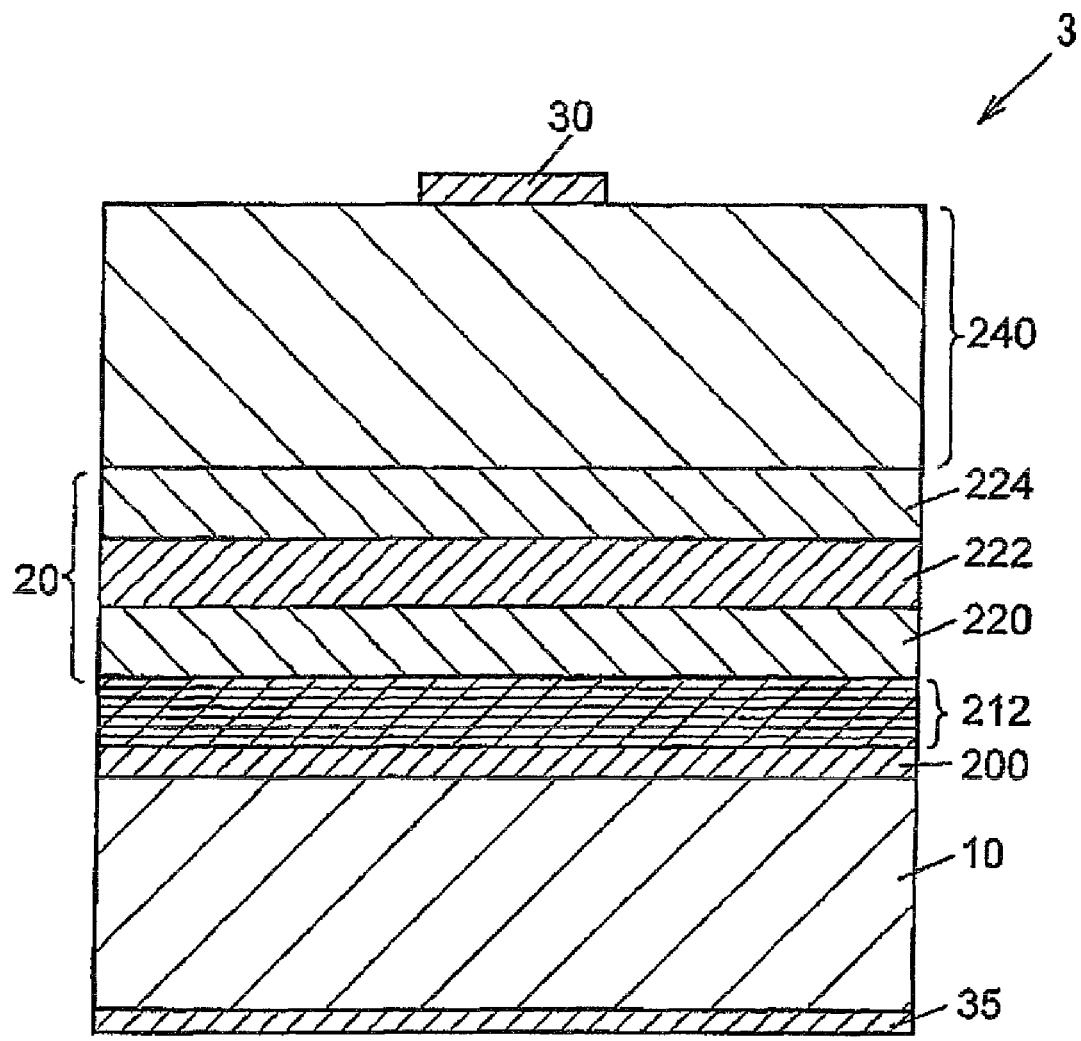
FIG. 11 is a cross-sectional view schematically showing a light emitting part of a light emitting element according to Comparative Example 1.
Figure 12:
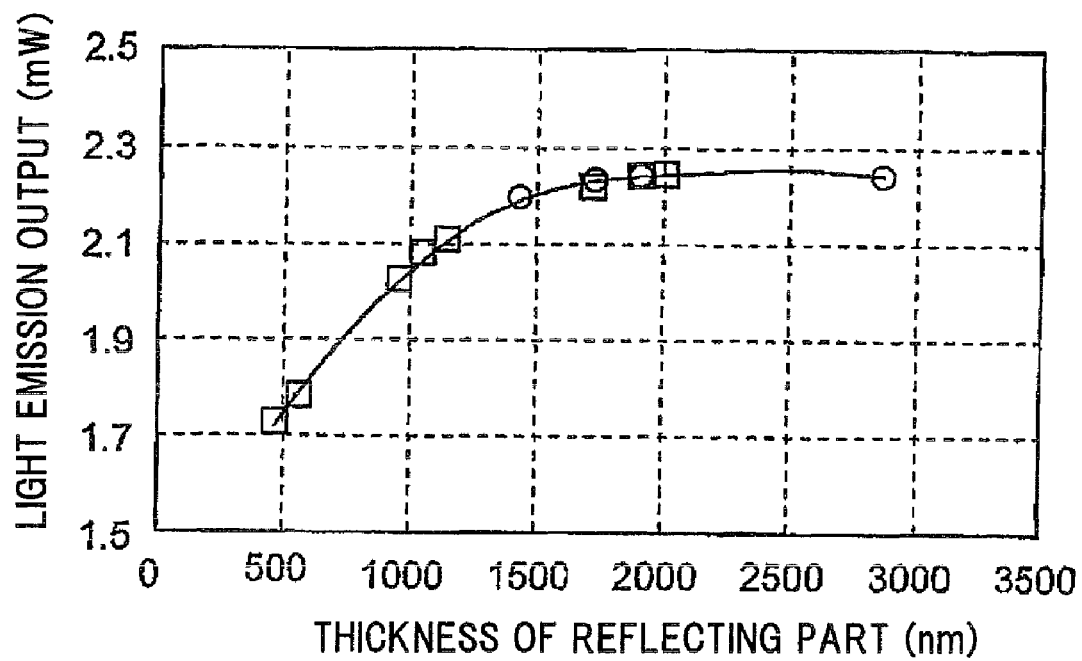
FIG. 12 is a graph schematically showing variation of a light emission output due to difference in a thickness of a reflecting part of Comparative Example 1.

FIG. 11 is a cross-sectional view schematically showing a light emitting part of a light emitting element according to Comparative Example 1 and FIG. 12 is a graph schematically showing variation of a light emission output due to difference in a thickness of a reflecting part of Comparative Example 1.

The light emitting element according to Comparative Example 1 includes almost the same composition and function as the light emitting element of Example 1 except for the composition of the reflecting part 212 etc., so that a detail explanation will be omitted except for the different points from the light emitting element according to Example 1.

The reflecting part 212 of the light emitting element according to Comparative Example 1 has a plurality of pair layers formed of a AlAs layer as the first semiconductor layer and a $Al_{0.5}Ga_{0.5}As$ layer as the second semiconductor layer. And, in Comparative Example 1, the thickness of the first semiconductor layer and the thickness of the second semiconductor layer were controlled to have a thickness calculated from a formula of $\lambda_P/4n$. Here, $\lambda_P$ is a light emission peak wavelength of the light emitted from the active layer 222 and n is refractive index of the first semiconductor layer or the second semiconductor layer.

Particularly, since the light emission peak wavelength is 631 nm, the thickness $T_A$ of the AlAs layer as the first semiconductor layer according to Comparative Example is calculated as $T_A=631/(4\times3.114)=50.7$ nm, where 3.114 shows the refractive index of the AlAs layer. Also, the thickness $T_B$ of the $Al_{0.5}Ga_{0.5}As$ layer as the second semiconductor layer according to Comparative Example is calculated as $T_B=631/(4\times3.507)=45.0$ nm, where 3.507 shows the refractive index of the $Al_{0.5}Ga_{0.5}As$ layer. Consequently, the light emitting element according to Comparative Example 1 was manufactured so as to include the reflecting part 212 having the pair layers formed of the first semiconductor layer and the second semiconductor layer having the above-mentioned thickness.

Also, light emitting elements where the pair number of the pair layers included in the reflecting part 212 was variously changed were manufactured. Particularly, if the pair number of the pair layers included in the reflecting part 212 becomes not less than 20, the light emission output of the light emitting element according to Comparative Example 1 is saturated, so that the light emitting elements where the pair number of the pair layers included in the reflecting part 212 is respectively set to 15 pairs, 18 pairs, 20 pairs and 30 pairs were manufactured. Table 3 and FIG. 12 show a result of evaluating properties of the light emitting element according to Comparative Example 1.

TABLE 3

| Thickness of reflecting part 210 (nm) | Number of pair layers | Light emission output (mW) |
|---|---|---|
| 1436 | 15 | 2.210 |
| 1723 | 18 | 2.235 |
| 1915 | 20 | 2.242 |
| 2871 | 30 | 2.249 |

FIG. 12 is a graph schematically showing a relationship between a thickness of a reflecting part and a light emission output according to Comparative Example 1. Particularly, FIG. 12 simultaneously shows a result of previous investigation of the same light emitting element as the light emitting element according to Comparative Example 1 (the light emitting element investigated at this time). In FIG. 12, a mark of square shows a result of previous investigation and a mark of circle shows a result of investigation at this time.

As seen from Table 3 and FIG. 12, if the pair number of the pair layers of the reflecting part 212 becomes not less than 15, the light emission output shows a tendency of saturation, and if the pair number is not less than 18, an enhancement of the light emission output was only within a range of variation, namely, not more than 1%. Namely, it was shown that if the thickness becomes about 1.7 μm and the pair number of the pair layer becomes about 18, an enhancement of the light emission output can not be desired in the reflecting part 212 of the light emitting element according to Comparative Example 1. Referring to the result of investigation at this time of the light emitting element according to Comparative Example 1 and the result of previous investigation of the same light emitting element as the light emitting element according to Comparative Example 1, it was shown that the tendency of saturation of the light emission output is reproducible.

In Comparative Example 1, the uneven part 250 is not formed on the surface of the electric current dispersing layer 240. Then, a sample was fabricated from the light emitting element including the reflecting part 210 of 2871 nm in thickness so as to form the uneven part 250 on the surface of the electric current dispersing layer 240, and LED property of the sample was evaluated. Table 4 shows the result.

TABLE 4

| | Surface roughening treatment time (sec) | | | |
|---|---|---|---|---|
| | 0 | 15 | 30 | 60 |
| Light emission output (mW) | 2.249 | 2.042 | 2.043 | 2.068 |
| Comparison with case that surface roughening treatment time is 0 sec (%) | 100 | 90.8 | 90.8 | 92.0 |

The light emission output of the light emitting element that does not include the uneven part 250 was 2.249 mW. Also, it was shown that in the light emitting element where the roughening treatment was applied to the surface of the electric current dispersing layer 240, the light emission output is reduced about 10% in comparison with the light emitting element that does not include the uneven part 250. Namely, it was confirmed that in Comparative Example 1, if the surface of the electric current dispersing layer 240 is roughened, the light emission output is reduced, and the composition of the light emitting element explained in Examples is required in order to increase the light emission output. Further, when unevenness size of the light emitting element according to Comparative Example 1 having the uneven part 250 was evaluated, any of Ra, RMS and Ry was almost equal to those of Example 1. Namely, it was confirmed that the light emission output was not reduced due to variation of the uneven part 250 or the like.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting element, comprising:
   a semiconductor substrate;
   a light emitting part having a first conductivity type first cladding layer; a second conductivity type second cladding layer different from the first cladding layer in the conductivity type and an active layer sandwiched between the first cladding layer and the second cladding layer;
   a reflecting part for reflecting a light emitted from the active layer, disposed between the semiconductor substrate and the light emitting part so as to have a thickness of 1.7 μm to 8.0 μm; and
   an electric current dispersing layer disposed on a side of the light emitting part opposite to the reflecting part, having a concave-convex part on the surface thereof, wherein the reflecting part is formed so as to have at least three pair layers formed of a first semiconductor layer and a second semiconductor layer different from the first semiconductor layer,
   the first semiconductor layer has a thickness $T_A$ defined by the formula (1), wherein peak wavelength of the light emitted from the active layer is $\lambda_P$, refractive index of the first semiconductor layer is $n_A$, refractive index of the second semiconductor layer is $n_B$, refractive index of the first cladding layer is $n_{In}$, and incident angle of light to the second semiconductor layer is θ,
   the second semiconductor layer has a thickness $T_B$ defined by the formula (2), and
   a plurality of pair layers of the reflecting part have a different thickness to each other according as values of the incident angle of light θ in the formula (1) and (2) are different with respect to each pair layer, and at least one pair layer includes the first semiconductor layer and the second semiconductor layer defined by that the incident angle of light θ is not less than 50 degrees $$T_A = \frac{\lambda_p}{4n_A \sqrt{1 - \left(\frac{n_{In}\sin\theta}{n_A}\right)^2}} \quad (1)$$

$$T_B = \frac{\lambda_p}{4n_B \sqrt{1 - \left(\frac{n_{In}\sin\theta}{n_B}\right)^2}}. \quad (2)$$

2. The light emitting element according to claim 1, wherein the reflecting part has not less than 15 pair layers.

3. The light emitting element according to claim 2, wherein the pair layers include the first semiconductor layer having the thickness $T_A$ of not less than 1.5 times of $\lambda_P/4n_A$ and the second semiconductor layer having the thickness $T_B$ of not less than 1.5 times of $\lambda_P/4n_B$.

4. The light emitting element according to claim 3, wherein the first semiconductor layer is formed of $Al_xGa_{1-x}As$, where $0 \leq x \leq 1$, and the second semiconductor layer is formed of $Al_yGa_{1-y}As$, where $0 \leq y \leq 1$, and has refractive index different from that of the first semiconductor layer.

5. The light emitting element according to claim 4, wherein the first semiconductor layer located at the first pair layer or the first and second pair layers of the reflecting part from a side of the semiconductor substrate is formed of AlAs, the second semiconductor layer located at the first pair layer or the first and second pair layers of the reflecting part from the side of the semiconductor substrate is formed of $Al_xGa_{1-x}As$, where $0 \leq x \leq 1$, having bandgap energy smaller than that of the semiconductor constituting the active layer, or $Al_xGa_{1-x}As$, where $0 \leq x \leq 1$, opaque to the light emitted from the active layer, and the first semiconductor layer and the second semiconductor layer located at the third or later pair layers of the reflecting part from the side of the semiconductor substrate are formed of $Al_xGa_{1-x}As$, where $0 \leq x \leq 1$, transparent to the light emitted from the active layer.

6. The light emitting element according to claim 3, wherein the first semiconductor layer and the second semiconductor layer are formed of $(Al_xGa_{1-x})_yIn_{1-y}P$, where $0 \leq x \leq 1$, $0.4 \leq y \leq 0.6$, having refractive index different from each other.

7. The light emitting element according to claim 3, wherein the first semiconductor layer is formed of $(Al_xGa_{1-x})_yIn_{1-y}P$, where $0 \leq x \leq 1$, $0.4 \leq y \leq 0.6$ and the second semiconductor layer is formed of $Al_xGa_{1-x}As$, where $0 \leq x \leq 1$, or the first semiconductor layer is formed of $Al_xGa_{1-x}As$, where $0 \leq x \leq 1$ and the second semiconductor layer is formed of $(Al_xGa_{1-x})_yIn_{1-y}P$, where $0 \leq x \leq 1$, $0.4 \leq y \leq 0.6$.

8. The light emitting element according to claim 1, wherein the electric current dispersing layer includes a first electric current dispersing layer and a second electric current dispersing layer having carrier concentration or impurity concentration different from each other, the second electric current dispersing layer is formed in a side of surface of the electric current dispersing layer so as to have the carrier concentration or the impurity concentration higher than the first electric current dispersing layer.

9. The light emitting element according to claim 1, further comprising:

a surface electrode formed on the surface of the electric current dispersing layer; and a light extracting layer is formed on the surface of the electric current dispersing layer except for a region where the surface electrode is formed so as to be formed of a material being transparent to the light emitted from the active layer and having refractive index at the level intermediate between the semiconductor constituting the electric current dispersing layer and air.

10. The light emitting element according to claim 9, wherein the light extracting layer has a thickness d that is ranged within ±30% of a value defined by a formula of $A \times \lambda_P/(4 \times n)$, if wavelength of the light emitted from the active layer is $\lambda_p$, refractive index of the material constituting the light extracting layer is n and A is a constant number, where A is odd numbers.

* * * * *